US012414261B2

(12) United States Patent
R. et al.

(10) Patent No.: US 12,414,261 B2
(45) Date of Patent: Sep. 9, 2025

(54) THERMAL MANAGEMENT SYSTEMS FOR ELECTRONIC DEVICES AND RELATED METHODS

(71) Applicant: The Intel Corporation, Santa Clara, CA (US)

(72) Inventors: Arunpandi R., Bangalore (IN); Kathiravan D, Bangalore (IN); Triplicane Gopikrishnan Babu, Bengaluru (IN); Doddi Raghavendra, Bangalore (IN); Ritu Bawa, Bangalore (IN); Bijendra Singh, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 17/711,821

(22) Filed: Apr. 1, 2022

(65) Prior Publication Data

US 2022/0225536 A1 Jul. 14, 2022

(30) Foreign Application Priority Data

Jun. 25, 2021 (IN) ............................. 202141028573

(51) Int. Cl.
*H05K 7/20* (2006.01)
*G06F 1/20* (2006.01)

(52) U.S. Cl.
CPC ......... *H05K 7/20172* (2013.01); *G06F 1/203* (2013.01); *H05K 7/20145* (2013.01);
(Continued)

(58) Field of Classification Search
CPC ........... H05K 7/20172; H05K 7/20145; H05K 7/20154; H05K 7/20509; H05K 7/20518; G06F 1/203
(Continued)

(56) References Cited

U.S. PATENT DOCUMENTS 8,584,735 B2 * 11/2013 Gerlach ................ F28F 13/187 165/80.3
9,194,575 B2 * 11/2015 Sharma ................... F21V 29/74
(Continued)

FOREIGN PATENT DOCUMENTS

EP 3407691 A1 * 11/2018 ........... H05K 1/0272
WO WO-2017052810 A1 * 3/2017 ............. G06F 1/203

OTHER PUBLICATIONS

Bock et al., "Evaluation and Opportunities for Use of Thin Form Factor Synthetic Jets to Low Profile Electronics Cooling Applications", Dec. 18, 2012, Electronics Cooling magazine (Year: 2012).*

*Primary Examiner* — Anatoly Vortman
*Assistant Examiner* — Kyle Oxenknecht
(74) *Attorney, Agent, or Firm* — Hanley, Flight & Zimmerman, LLC

(57) ABSTRACT

Synthetic jet systems and related methods are disclosed. An electronic device includes a heat spreader including a first surface and a second surface opposite the first surface. A synthetic jet is coupled to the first surface of the heat spreader. The synthetic jet and the heat spreader define a fluid flow passageway having an inlet, a first outlet and a second outlet. The synthetic jet and the heat spreader to bifurcate airflow from the inlet such that the first outlet is to exhaust airflow from the passageway adjacent the first surface of the heat spreader and the second outlet is to exhaust airflow from the passageway adjacent the second surface of the heat spreader.

25 Claims, 25 Drawing Sheets

(52) U.S. Cl.
CPC ..... *H05K 7/20154* (2013.01); *H05K 7/20509* (2013.01); *H05K 7/20518* (2013.01)

(58) Field of Classification Search
USPC .......................................................... 361/696
See application file for complete search history.

(56) References Cited

U.S. PATENT DOCUMENTS

| | | | | |
|---|---|---|---|---|
| 2007/0119575 | A1* | 5/2007 | Glezer | H01L 23/427 165/104.33 |
| 2012/0097377 | A1* | 4/2012 | Arik | H05K 7/20172 165/185 |
| 2013/0213618 | A1* | 8/2013 | Arik | H01L 23/467 165/121 |
| 2016/0360606 | A1* | 12/2016 | Saeidi | H05K 1/0203 |

* cited by examiner

1001

602
1000
602
x
y
SIDE VIEW
1000
C COVER
PCB
SOC
SPREADER
MEMORY
FET
FET
INLET VENTS
1002
602
416
650
408
406
1003a
1005
602
1004a
1003
1005
1004b
1004
x
z 1000
1014
610
1006
602
1016
VENT
DUCT
1026
1018
1006
610
602
608
1002
TOP VIEW FROM D COVER SIDE
1004a
1004

THERMAL MANAGEMENT SYSTEMS FOR ELECTRONIC DEVICES AND RELATED METHODS

CROSS-REFERENCE TO RELATED APPLICATION

This patent claims the benefit to Indian Provisional Patent Application No. 2021/41028573, which was filed on Jun. 25, 2021, and which is hereby incorporated herein by reference in its entirety. Priority to Indian Provisional Patent Application No. 2021/41028573 was filed with the Intellectual Property of India on Jun. 25, 2021, and is hereby claimed.

FIELD OF THE DISCLOSURE

This disclosure relates generally to electronic devices, and, more particularly, to thermal management systems for electronic devices and related methods.

BACKGROUND

Electronic devices employ thermal designs to manage thermal conditions. To manage thermal conditions, electronic devices employ thermal cooling systems that cool electronic components of the electronic devices during use.

Figure 1A:
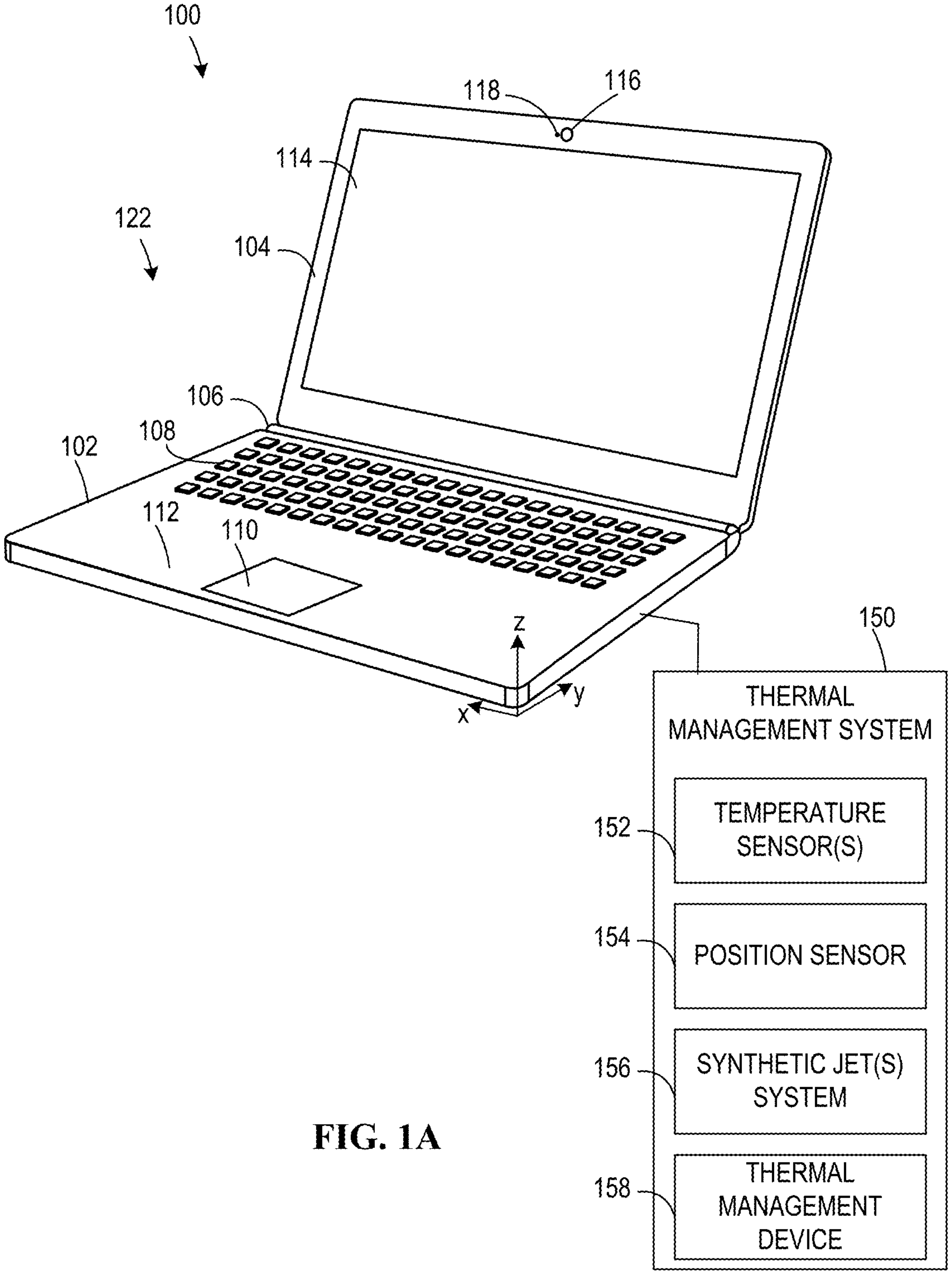
FIG. 1A is an example electronic device constructed in accordance with teachings of this disclosure.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some, or all of these lines and/or boundaries may be idealized. The boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer those two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" refer to dimensions that may not be exact due to manufacturing tolerances and/or other real—world imperfections. For example, the dimensions may be within a tolerance of plus or minus ten percent (10%).

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPU s, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

DETAILED DESCRIPTION

During operation of an electronic device (e.g., a laptop, a tablet, etc.), hardware components such as a processor, graphics card, semiconductor devices, logic circuitry, analog and/or digital circuitry and/or one or more batteries, disposed in a body or housing of the device generate heat. Heat generated by the hardware components of the electronic device can cause a temperature of one or more electronic components to exceed maximum operating temperature limits of the one or more electronic components and/or cause a temperature of a skin enclosure to approach and/or exceed a desired maximum allowable temperature. To prevent overheating of the hardware components and/or skin enclosure temperatures from exceeding a desired skin temperature threshold, electronic devices include thermal management systems to dissipate heat from the electronic devices. Example thermal management systems can include passive cooling systems or active cooling systems.

Passive cooling systems employ natural convection and heat dissipation by utilizing heat spreaders or heat sinks to increase (e.g., maximize) radiation and convection heat transfer. For instance, passive cooling systems do not employ external devices such as fans or blowers that would otherwise force airflow to exhaust heat from the housing of the electronic device. Instead, passive cooling systems rely on material characteristic(s) to provide heat transfer pathways between electronic components and outer surfaces or skins of the electronic devices. Additionally, or alternatively, passive cooling can be implemented by a throttling policy of an electronic device. For instance, to cool one or more electronic components using passive cooling throttling, power to one or more electronic components can be reduced and/or throttled to cool the hardware components and/or skin enclosure. Passive cooling systems are significantly less expensive than active cooling systems and/or do not generate noise during operation. However, passive cooling systems may not often manage heat dissipation requirements during certain operations performed by electronic devices (e.g., high speed computing).

Active cooling systems employ forced convection methods to increase a rate of fluid flow, which increases a rate of heat removal. For example, to exhaust heat generated within the body of the electronic device and cool the electronic device, active cooling systems often employ external devices such as fans or blowers, forced liquid, thermoelectric coolers, etc. For certain electronic devices (e.g., laptops, tablets, mobile devices, etc.), a fan can provide a thermal solution to safeguard system performance to a target thermal design power. However, active cooling systems employing fans often require additional space. Placement of a fan can be challenging in electronic devices due to space constraints within housings of the electronic devices. Additionally, active cooling systems such as fans can sometimes increase noise to undesired levels during use, which can lead to poor user experience.

Other thermal solutions employ ultra-thin fans (e.g., fans having a thickness of less than 3 millimeters). However, ultra-thin fans may not be effective when used in space constrained systems and, thus, can perform less than desired. For example, traditional ultra-thin blower fans response can be slow in a small zone of influence due to low airflow exit velocities, thereby reducing cooling performance. Additionally, because ultra-thin fan cooling underperforms, SoC components and non-SoC components are often throttled to avoid overheating. Thus, thermal management systems employing ultra-thin fans can lead to poor user experience.

Other example thermal management solution includes synthetic jet cooling. Unlike traditional fans, synthetic jets generate high velocity pulsating jets to create local turbulent flows that can instantly and/or rapidly cool hot spots on a skin, a glass cover and/or other component of the electronic device generated during use.

Furthermore, synthetic jet systems enable products to achieve a small form factor and provide a power density associated with active cooling, without a low system Mean Time Between Failure (MTBF) (e.g., an average time that equipment is operating between breakdowns or stoppages) of fans and/or space requirements of fans. Additionally, synthetic jet devices have relatively low acoustic output.

In operation, synthetic jets provide an unsteady, pulsating airflow or jet that sweeps over or across a heated surface. Vortices inherent to flow create fluid mixing. Synthetic jets inherently have high stream velocities that create local turbulent flow (e.g., even for very-low profile and/or smaller thickness geometries) compared to traditional fans. Specifically synthetic jets employ flexible diaphragms to generate a turbulent, pulsating airflow that can be directed at precise locations for hot-spot cooling. The oscillating diaphragms create high-velocity pulses of air. The high-velocity pulses of air remove heat conducted by the heat sink and pull entrained air from an area in its wake. This fluid mass flow carries heat away from a heat sink.

Some example synthetic jet systems include jets positioned or located directly above (e.g., on top of) a system on chip (SoC) assembly. Such an assembly typically includes a heat spreader. However, the heated area immediately below the heat spreader is typically the hottest region. As a result, air pulled into a flow path of the jets is relatively hot air, which cannot absorb additional heat and, thus, does not provide much cooling effect.

Examples disclosed herein include synthetic jet systems and related methods. Specifically, example synthetic jet cooling systems disclosed herein advantageously modify and/or improve thermal performance based on system ergonomic specifications and/or performance expectations that vary on usage modes and system positions. For example, a notebook computer or laptop when used in an on-table mode has a higher on-table performance expectation compared to an on-lap performance when the laptop is used in an on-lap mode. The example synthetic jet cooling systems and related methods disclosed herein account for different ergonomic touch temperature specifications and/or performance expectations.

Example synthetic jet systems disclosed herein employ one or more synthetic jets. Specifically, unlike known synthetic jet systems, example synthetic jet systems disclosed herein employ one or more jets positioned or located away from a core processor and/or system on chip (SoC). Additionally, example synthetic jet systems disclosed herein include fluid flow redistribution systems. For example, fluid flow redistribution systems disclosed herein can include one or more features (e.g., openings or slots) in a heat spreader that allows relatively high temperature generated by a processor and/or a processor region, thereby increasing cool airflow in a core zone (e.g., at the SoC region containing the processor circuitry) to improve heat transfer efficiency. In particular, redistribution features disclosed herein increase airflow through a heat exchanger region, thereby improving cooling compared to systems that employ synthetic jets without example redistribution features disclosed herein. For instance, by redistributing the flow, example redistribution features disclosed herein can increase synthetic jet cooling capability by at least 40% compared to one or more prior art systems.

Additionally, some examples disclosed herein employ synthetic jet configurations to improve heat transfer and/or heat removal from processor circuitry, SoC components, and/or non-system on chip components such as, for example, off chip memory. Specifically, synthetic jets disclosed herein are mounted strategically relative to a core processor to improve cooling (e.g., hot spot cooling). In some examples, synthetic jet systems and related methods disclosed herein employ one or more synthetic jet(s) for impingement cooling to almost instantaneously mitigate a skin hot spot based on a detected physical position of the electronic device. Example synthetic jet cooling systems and related methods disclosed herein operate in an active cooling mode based on a detected position (e.g., on-desk vs on-lap, clamshell position, tent, etc.) of the electronic device and skin hotspot temperature(s) detected by (e.g., one or more sensors of) the synthetic jet cooling system. Based on a detected position of the electronic device, example cooling systems and related methods disclosed herein can be operate under an active cooling scheme (e.g., synthetic jet "OFF"), allowing a higher power capability for higher on-table skin temperature specifications or, alternatively, operate under an active cooling scheme or capability (synthetic jet "ON") to instantly cool the system to meet lower skin temperature (e.g., on-lap) specification when a control system (e.g., via a sensor) detects a change in usage position or mode (e.g., a clamshell mode, a laptop mode, etc.).

In some instances, example synthetic jet systems and related methods disclosed herein can provide up to 5° C. (Celsius) difference for on-table configurations versus on-lap configurations, which can provide up to 5-6 Watts (W) additional power (e.g., which is approximately between 40-60% greater system thermal capability compared to a typical passive design or known synthetic jet systems). In some examples, on-lap mode performance can further be enhanced by gradually updating a first power limit and/or a second power limit (PL1/PL2) settings (from higher to required lower) while adjusting a jet frequency of one or more synthetic jets. As a result, example synthetic jet cooling systems and related methods disclosed herein can provide full power wireless wide area network (WWAN) (e.g., up to 5 W) and solid-state storage device (SSD) (e.g., 5-8 W) performance without compromising processor performance by using targeted synthetic jet skin cooling. In some examples, dynamic control using frameworks like Intel® Dynamic Tuning Technology (DDT) can be employed to automatically and/or dynamically allocate power between an Intel® processor and an Intel® Discrete Graphics Card to improve (e.g., optimize) performance and/or improve battery life.

Additionally, example cooling systems and related methods disclosed herein provide a thermal control scheme. Specifically, the thermal control scheme can implement a quasi-active cooling system that can meet high performance requirements without user experience trade-off during position and/or mode change. For example, one or more synthetic jets (e.g., small size jets having between about 20-30 millimeters (mm) in length and less than about 1 mm in thickness) can be mounted in an electronic device to target skin hotspots in a processor (e.g., a core) region and/or other key component like WWAN and SSD. The example one or more synthetic jets can be triggered on or off (trigger ON/OFF) at a desired frequency based on: (1) a hotspot temperature feedback control; and (2) a device position/mode feedback control. In some examples, Intel's Dynamic Tuning Technology framework can be used for a feedback-based control. Virtual sensors (e.g., correlated with thermistors of a motherboard) can function as proxy for the skin hotspots. Example cooling systems disclosed herein can provide high performance processing when the electronic device is configured for on-table use by utilizing higher temperature threshold specifications. Example synthetic jets disclosed herein can be turned ON intermittently or selectively to give a performance boost for select activities. Based on sensor feedback, as a position/mode change indicative of a change from on-table to on-lap use (which have lower thermal threshold specification than the on-table thermal threshold specification), example synthetic jets disclosed herein can be turned ON for instant temperature reduction to meet lower thermal specifications for on-lap use. Processor frequencies can also be gradually lowered to required/lower performance levels. Such gradual lowering of the power limits can enhance on-lap performance and/or user experience.

FIG. 1A is an example electronic device 100 constructed in accordance with teachings of this disclosure. The electronic device 100 of the illustrated example is a mobile device (e.g., a rugged laptop, a laptop, etc.). The electronic device 100 of the illustrated example includes a first housing 102 coupled to a second housing 104 via a hinge 106 (e.g., a 360 degree hinge). To enable user inputs, the first housing 102 of the illustrated example includes a keyboard 108 and a track pad 110. For example, the keyboard 108 and the track pad 110 are exposed at an upper surface 112 of the second housing 104 (e.g., opposite a bottom surface 120 of FIGS. 1B-1D). The second housing 104 carries a display 114, a camera 116 and a microphone 118. The first housing 102 houses electronic components of the electronic device 100. The hinge 106 enables the second housing 104 to rotate or fold relative to first housing 102 between a stored position (e.g., where the second housing 104 is aligned or parallel with the first housing 102) and one or more open positions. In the example of FIG. 1A, the electronic device 100 is shown in an example laptop mode 122. In the laptop mode 122, the second housing 104 is rotated relative to the first housing 102 about the hinge 106 to a desired viewing angle (e.g., a viewing angle of between 90 degrees and 115 degrees relative to the upper surface 112 of the first housing 102) with the keyboard 108 exposed in front of the display 114. For example, during use in the laptop mode 122, the electronic device 100 is in a laptop mode can be positioned on a user's body (e.g., a user's lap).

Figure 1D:
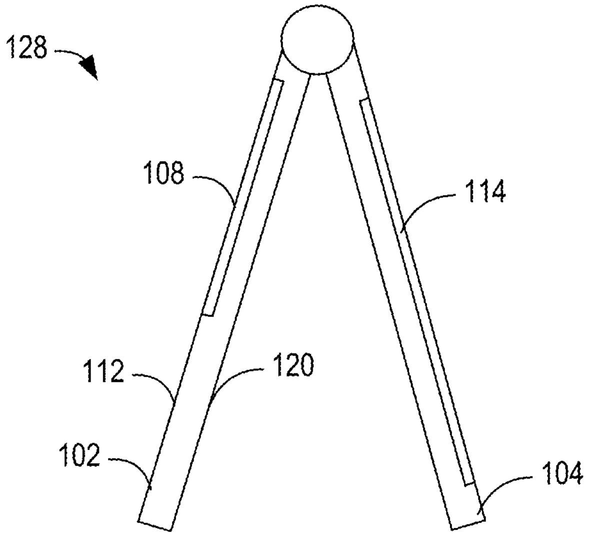
FIGS. 1B-1D illustrate different use case system mode of the example electronic device of FIG. 1A.
Figure 1B:
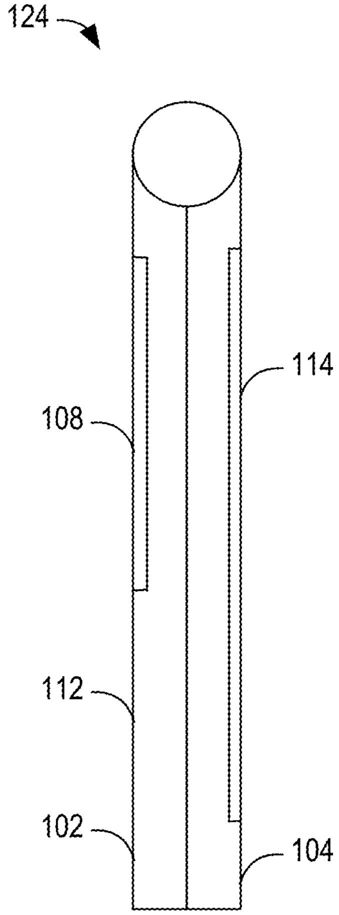
Figure 1C:
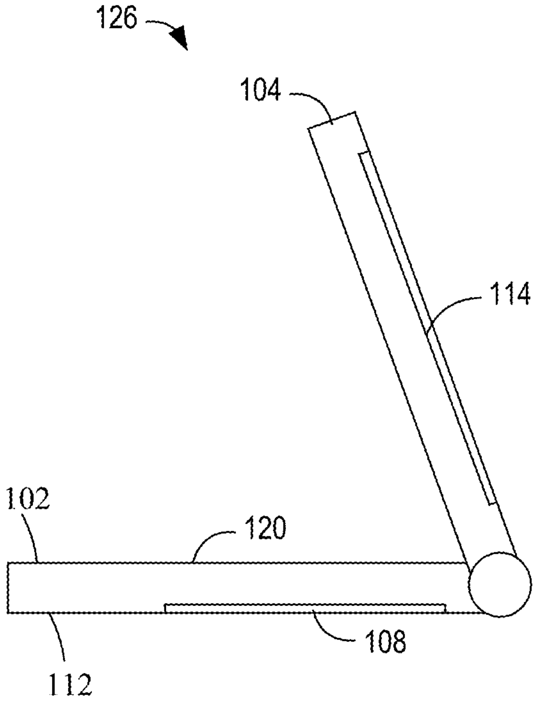

FIGS. 1B-1D illustrate different use positions (e.g., open positions) of the electronic device 100. In some examples, electronic device 100 enables, via the hinge 106, the second housing 104 to move to other open positions including, but not limited to, a tablet mode 124 as shown in FIG. 1B (e.g., with the keyboard 108 and the display 114 on opposite sides of the device and the display 114 exposed to the user), a kiosk mode 126 as shown in FIG. 1C, and a tent mode 128 as shown in FIG. 1D. In the tablet mode 124, the second housing 104 is rotated approximately 360 degrees from the closed position such that the second housing 104 is positioned on the first housing 102 with the display 114 exposed for user use (e.g., an outer surface 130 of the second housing 104 engages the bottom surface 120 of the first housing 102). In the kiosk mode 126, the second housing 104 is rotated to a viewing angle of greater than 180 degrees relative to the upper surface 112 of the first housing 102, and the keyboard 108 can engage and/or be adjacent a support surface (e.g., a table or desk) or a user's lap. In the tent mode 128, the second housing 104 is rotated relative to the first housing 102 to an angle that is greater than 270 degrees from the closed position such that respective edges of the first housing 102 and the second housing 104 can engage a support surface (e.g., a table or desk).

Referring to FIG. 1A, to remove heat from electronic components of the electronic device 100, the electronic device 100 of the illustrated example includes a thermal management system 150. The thermal management system 150 of the illustrated example includes one or more temperature sensor(s) 152 (e.g., a plurality of temperature sensors), one or more position sensor(s) 154, a synthetic jet system 156, and a thermal management device 158. The thermal management system 150 of the illustrated example includes temperature sensor(s) 152 (e.g., thermocouples) to measure temperature(s) associated with the hardware components of the electronic device 100, skin enclosure, and/or other component(s). The position sensor(s) 154 are employed to detect an open position and/or use mode configuration (e.g., the laptop mode 122, the tablet mode 124, the kiosk mode 126, and the tent mode 128 of the electronic device 100). The thermal management system 150 controls one or more of the synthetic jet system 156 based on temperatures provided by the temperature sensor(s) 152 and an open position or use mode orientation of the electronic device 100 as detected by the position sensor(s) 154. In some examples, the thermal management system 150 (e.g., synthetic jet system 156) of the illustrated example can be located in the first housing 102, the second housing 104 and/or any other location of the electronic device 100.

Although the electronic device 100 of the illustrated example is a laptop, in some examples, the electronic device 100 can be a tablet, a desktop, a mobile device, a cell phone, a smart phone, a hybrid or convertible PC, a personal computing (PC) device, a sever, a modular computing device, a digital picture frame, a graphic calculator, a smart watch, and/or any other electronic device that employs active cooling. For example, employing a mobile device (e.g., a tablet, etc.) can include a device orientation sensor to detect an orientation of the mobile device including, for example, upright orientation or stand position, a lap orientation, a hand-held orientation, etc.

Figure 2:
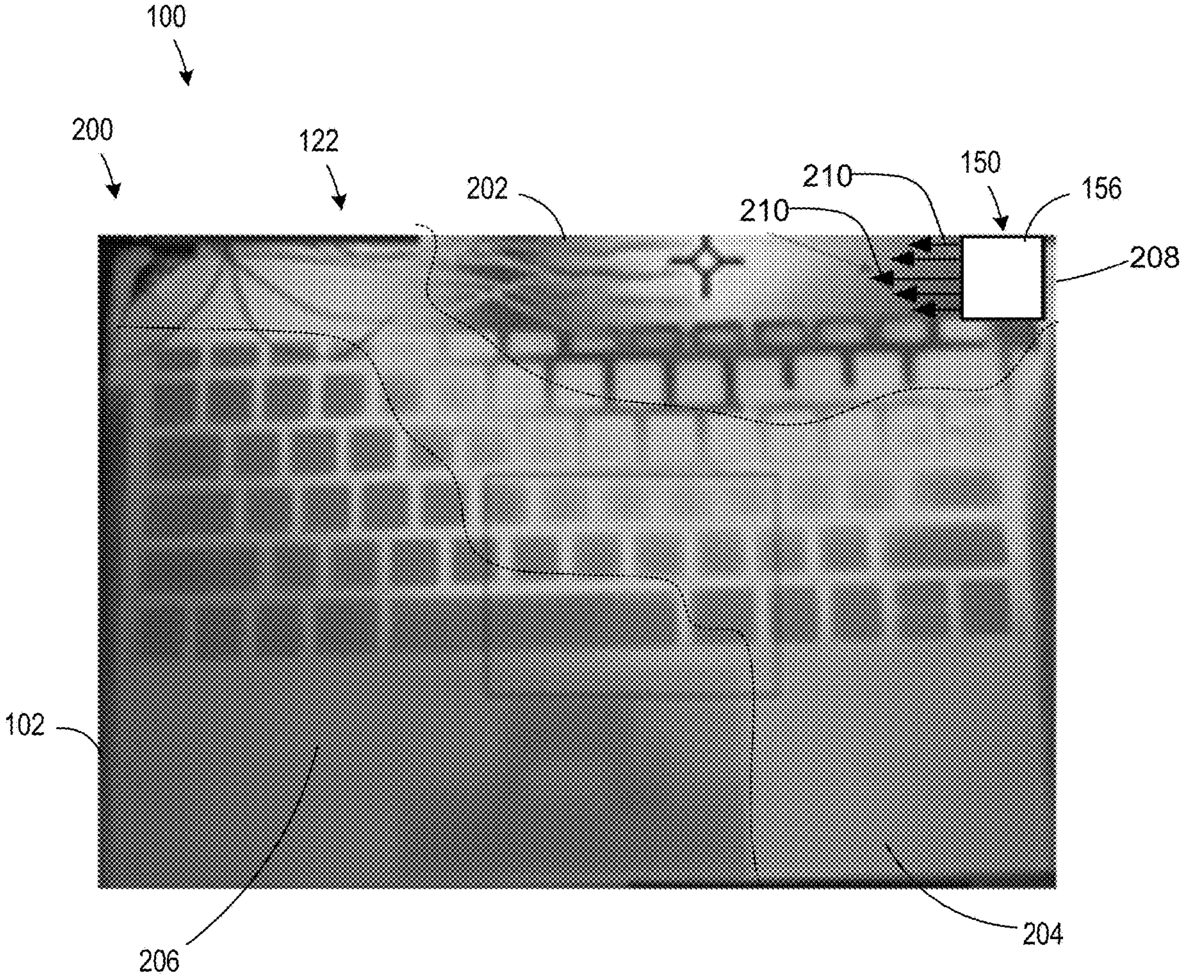
FIG. 2 is a partial, enlarged view of the example electronic device of FIG. 1A shown in an example open position.

FIG. 2 is a partial, enlarged view of the electronic device 100 shown in an open position (e.g., the laptop mode 122). Specifically, FIG. 2 illustrates an example heat distribution map 200 for heat generated in the first housing 102 during operation. The example heat distribution map 200 is overlayed on the first housing 102 of the electronic device 100 of FIG. 2. The heat distribution map 200 shows a hot spot zone 202 (e.g., an elevated heated zone), a medium heat zone 204 (e.g., a non-hot spot zone), and a cool zone 206 (e.g., a non-hot spot zone). In the illustrated example, the thermal management system 150 reduces a temperature of the hot spot zone 202 to a desired or specification temperature threshold. For example, the synthetic jet system 156 can be positioned adjacent an upper right corner 208 of the first housing 102 that can provide instant skin hot spot cooling to enhance system performance and/or user experience. In particular, to reduce the temperature of the hot spot zone 202, the synthetic jet system 156 of the illustrated example employs turbulent jets 210 (e.g., synthetic jets) directed towards the hot spot zone 202. The hot spot zone 202 of the illustrated example is 80 millimeters by 100 millimeters. However, in other examples, the hot spot zone 202 can be any sized area.

Figure 3:
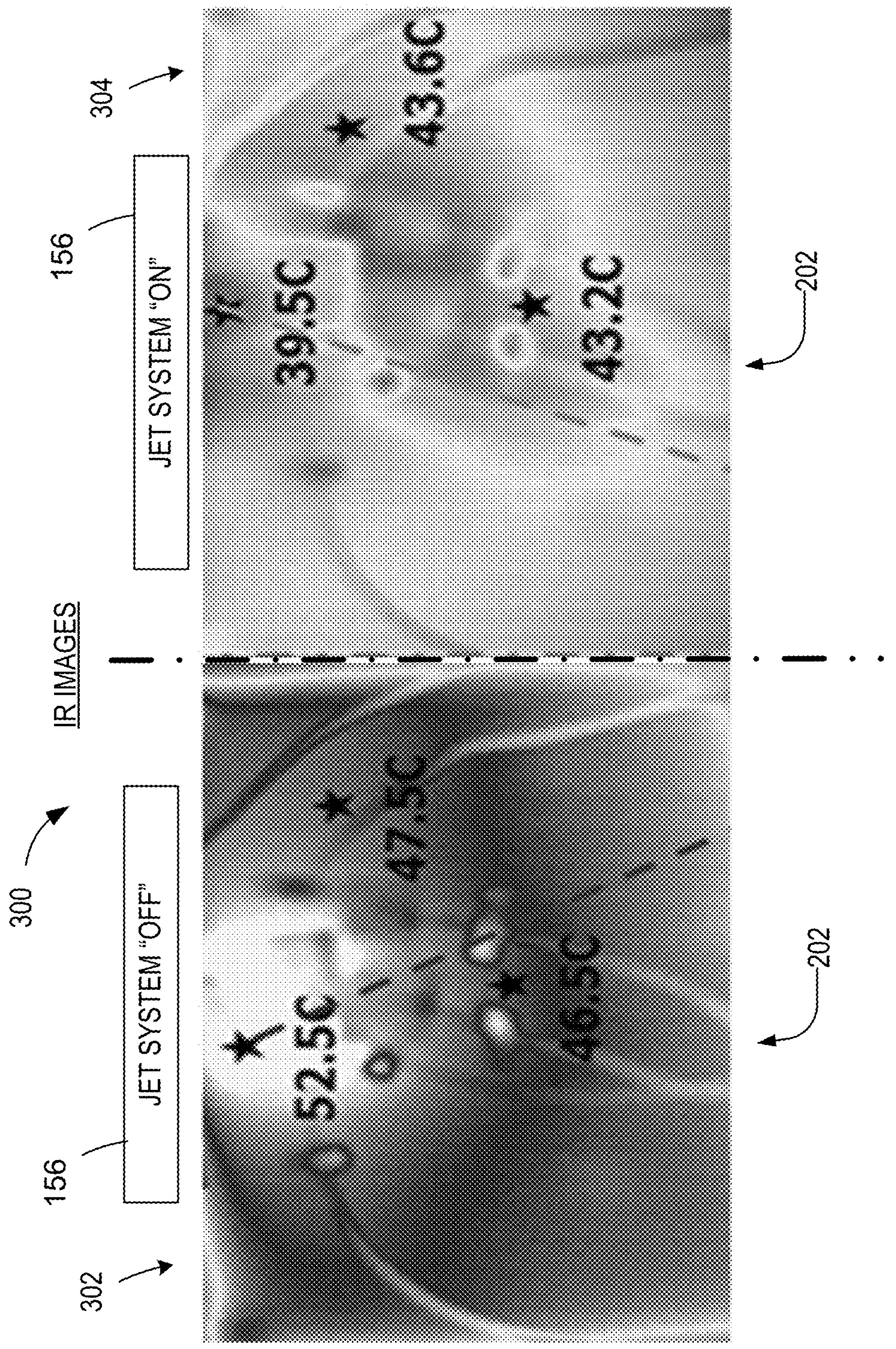
FIG. 3 illustrates measured synthetic jet data for skin hot spot cooling of an example hot spot zone of the example electronic device of FIG. 1A.

FIG. 3 illustrates infrared images of measured synthetic jet data 300 for skin hot-spot cooling of the hot spot zone 202 of FIG. 2. A first infrared image 302 illustrates a heat map of the hot spot zone 202 (e.g., an elevated temperature hot zone) when the synthetic jet system 156 is in a passive condition (e.g., a "turned off" condition or state) and a second infrared image 304 juxtaposed relative to the first infrared image 302 illustrates a heat map (e.g., a cooled zone) of the hot spot zone 202 when the synthetic jet system 156 is in an active condition (e.g., a "turned on" condition or state). Thus, in the illustrated example, the synthetic jet system 156 cooled the hot spot zone 202 from a temperature of approximately 52.2 degrees Celsius to a temperature of approximately 39.5 degrees Celsius. For example, in the illustrated example, the synthetic jet 156 has a dimension of 40 millimeters by 1 millimeter. The synthetic jet system 156 of the illustrated example can cool the hot spot zone 202 (e.g., a skin zone) by approximately 10° C. within 3-5 seconds (e.g., for an area of approximately 100 millimeters by 80 millimeters). The example of FIG. 3 can provide significantly more cooling by increasing a size of the synthetic jet system 156.

Figure 4A:
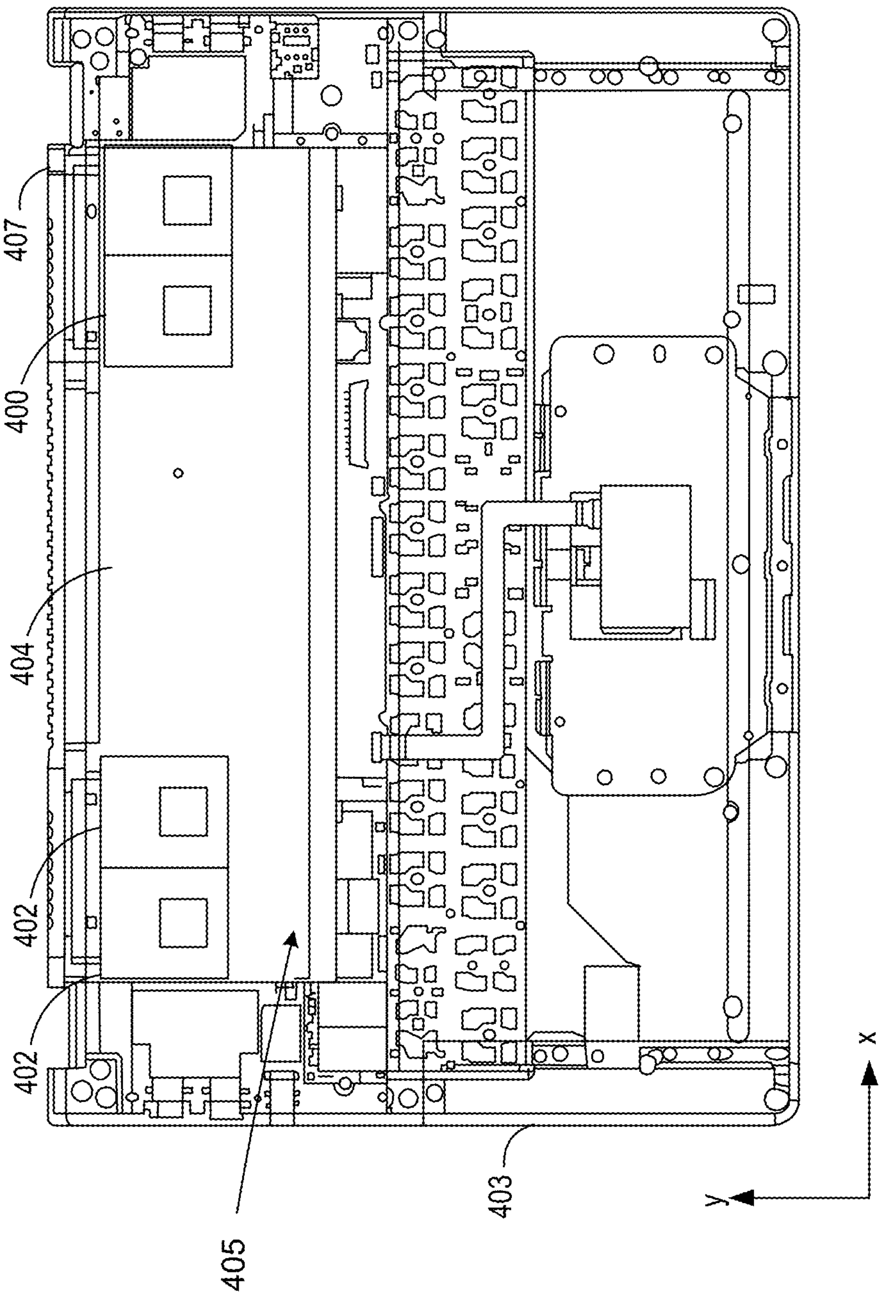
FIGS. 4A-4F illustrate an example synthetic jet cooling system disclosed herein.
Figure 4B:
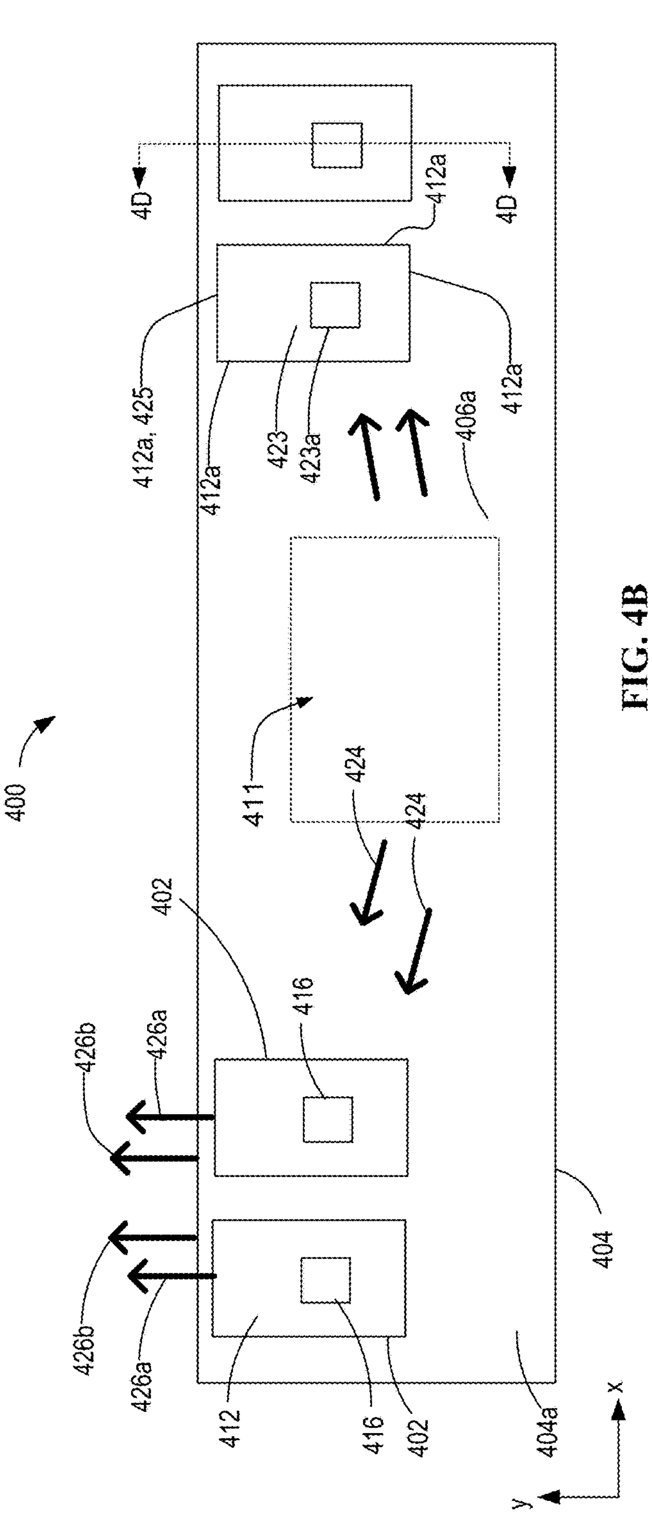
Figure 4C:
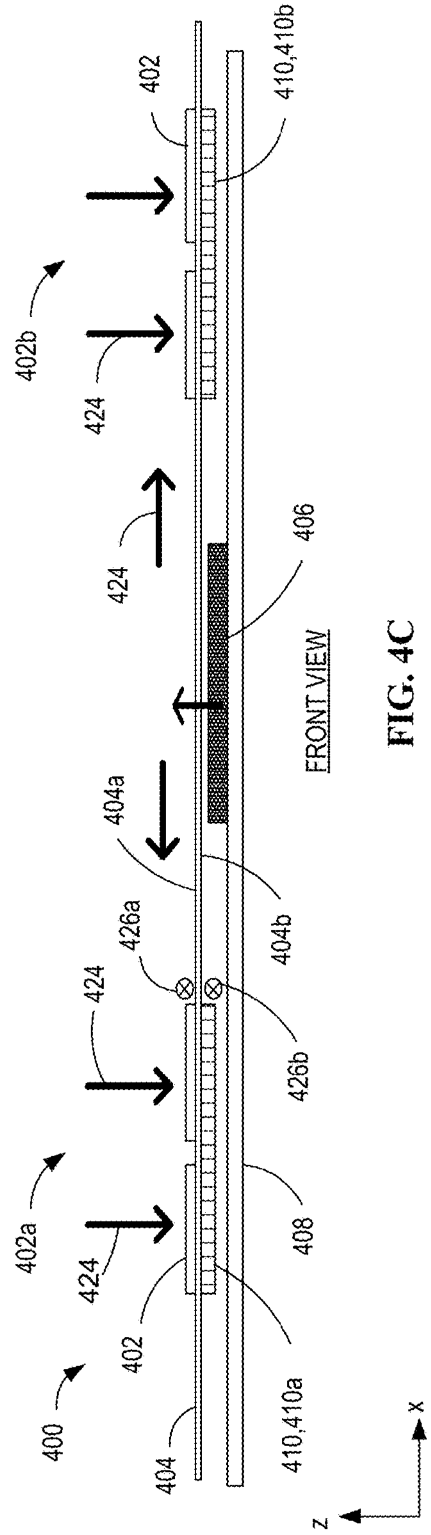
Figure 4D:
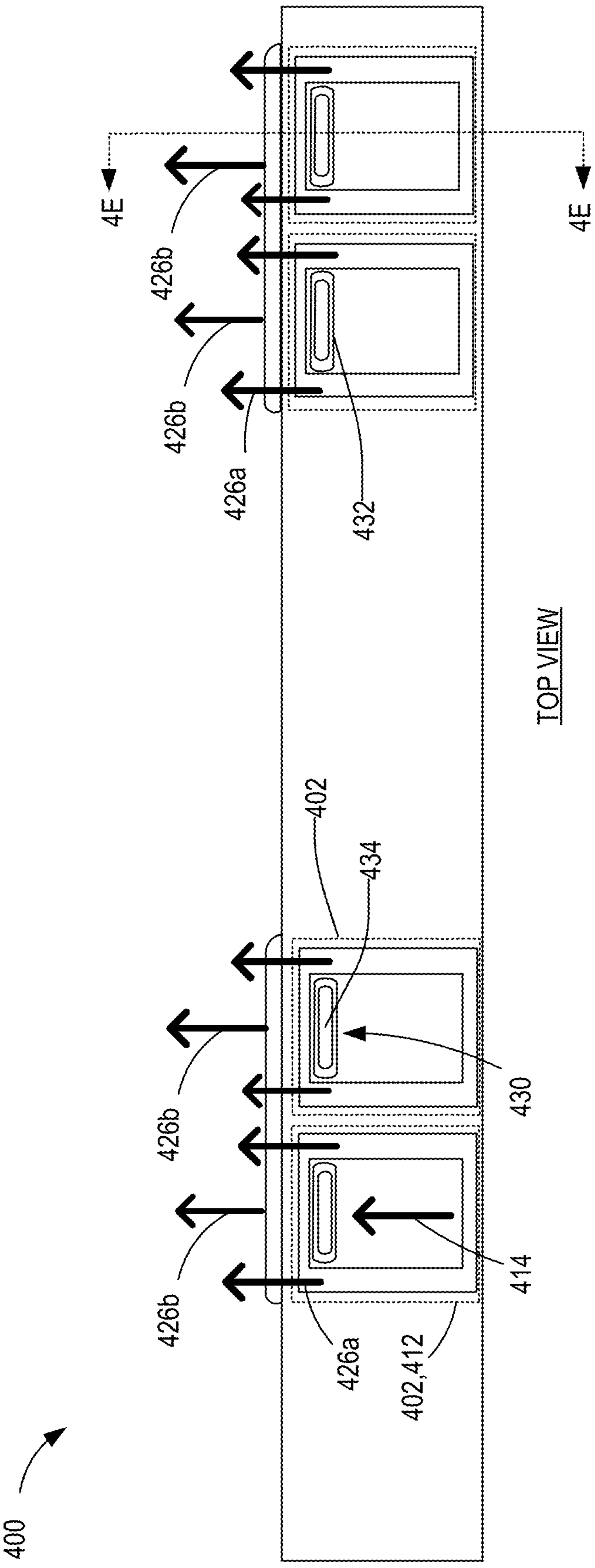
Figure 4E:
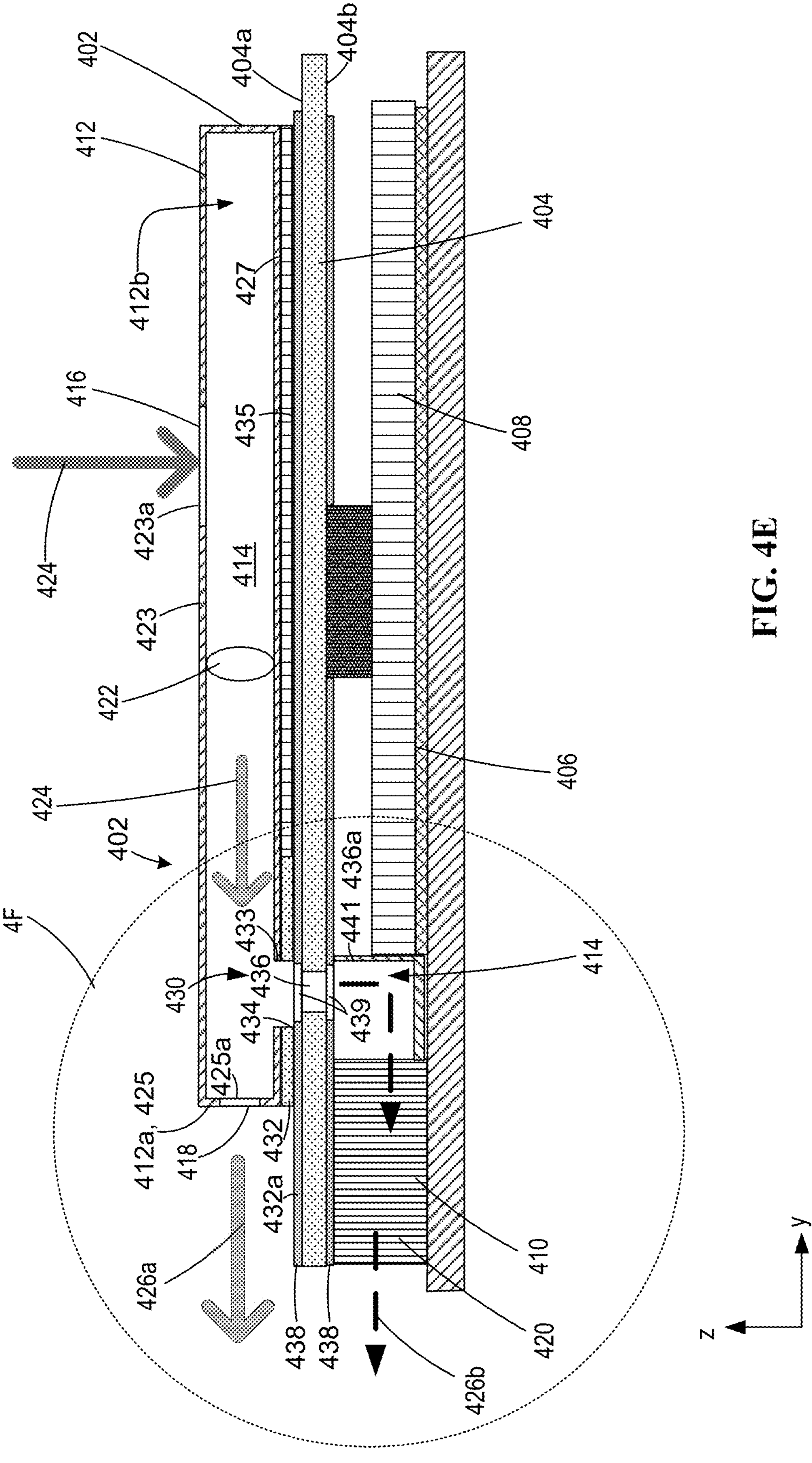
Figure 4F:
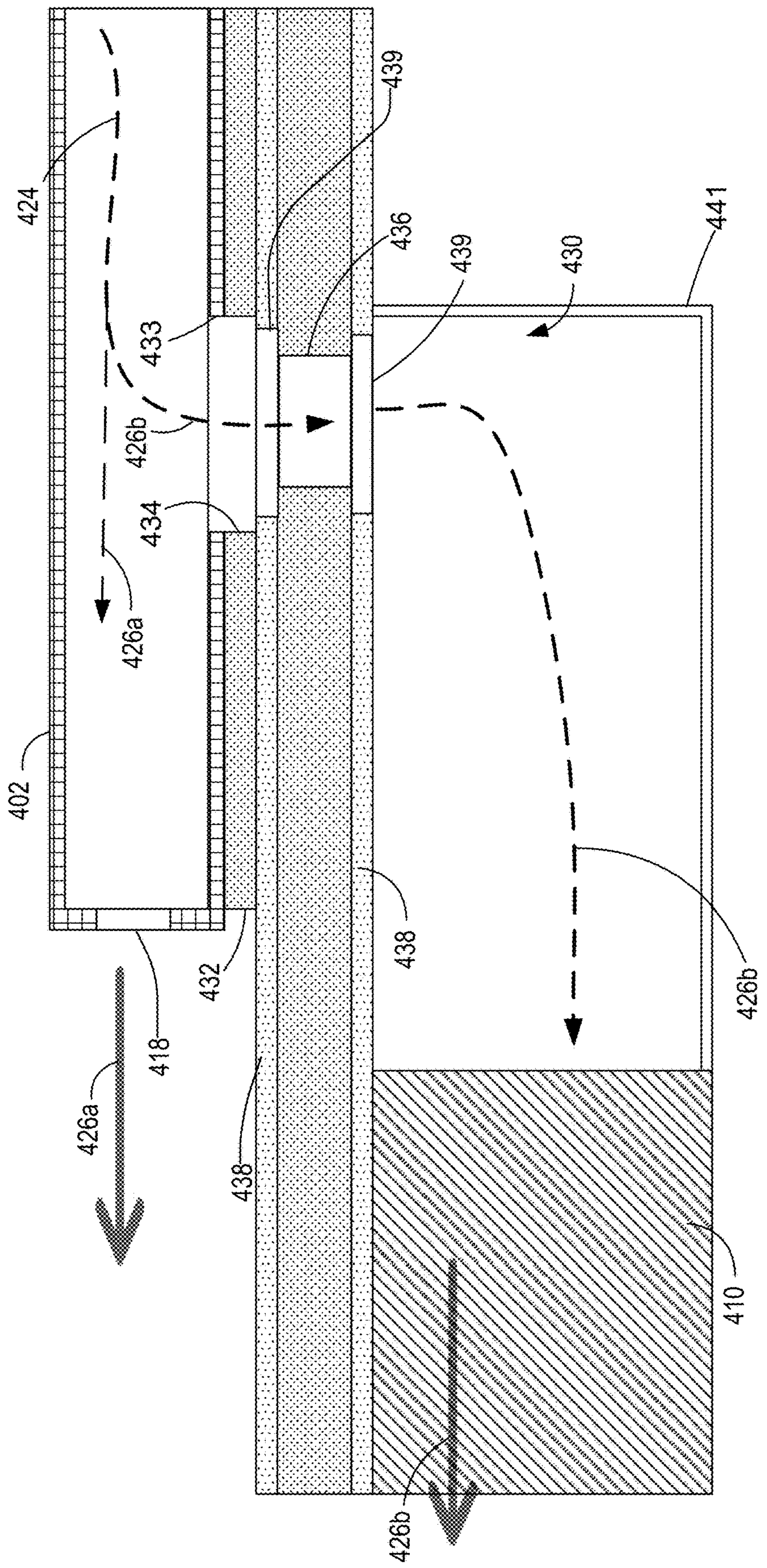

FIGS. 4A-4F illustrate an example synthetic jet system 400 constructed in accordance with teachings disclosed herein that can implement the example synthetic jet system 156 and/or the thermal management system 150 of FIGS. 1-3. FIG. 4A is a bottom view of an example electronic device 401 that includes the example synthetic jet system 400. FIG. 4B is a top view of the example synthetic jet system 400 constructed in accordance with teachings disclosed herein. FIG. 4C is a front view of the example synthetic jet system 400 of FIG. 4B. FIG. 4D is a top view of the example synthetic jet system 400 of FIG. 4B but shown without a heat spreader 404, a processor 406 and a printed circuit board 408. FIG. 4E is a cross-sectional view taken along line 4D-4D of FIG. 4B. FIG. 4F is a partial, cross-sectional view of the example synthetic jet system 400 of FIG. 4E.

Referring to FIG. 4A, the electronic device 401 is a housing 403 (e.g., a top view of the first housing 102 of FIG. 1) shown without a cover to illustrate the positioning of the synthetic jet system 400 relative to a cavity 405 of the housing 403. The synthetic jet system 400 of the illustrated example is positioned or located adjacent an edge 407 (e.g., a back wall) of the housing 403 that includes a hinge (e.g., the hinge 106 of FIG. 1) and/or a detachable mechanism (e.g., a tablet). In some examples, the housing 403 can be a housing (e.g., the second housing 104 of FIG. 1A) to house a display (e.g., a tablet, a touchscreen display or any other electronic device).

Referring to FIGS. 4B and 4C, the synthetic jet system 400 of the illustrated example includes a plurality of synthetic jets 402 (e.g., four jets), the heat spreader 404, a processor 406 (system on chip (SoC) or other semiconductor package), a printed circuit board 408, and heat exchangers 410. The heat spreader 404 is positioned adjacent (e.g., above) the processor 406. When the synthetic jet system 400 is assembled, the heat spreader 404 is positioned between the heat exchangers 410 and the synthetic jets 402, and the heat exchangers 410 are positioned between the heat spreader 404 and the circuit board 408. Specifically, the synthetic jets 402 are positioned adjacent (e.g., directly on) a first side or surface 404*a* (e.g., an upper surface) of the heat spreader 404 and the heat exchangers 410 are positioned adjacent (e.g., directly on) a second side or surface 404*b* (e.g., a lower surface) of the heat spreader 404 opposite the first surface 404*a*. In the illustrated example, a first heat exchanger 410*a* is associated with a first set 402*a* (e.g., pair) of the synthetic jets 402 and a second heat exchanger 410*b* is associated with a second set 402*b* (e.g., a pair) of the synthetic jets 402. In some examples, each jet includes a dedicated heat exchanger. In some examples, any number of heat exchangers and/or jets can be employed. In some examples, the heat exchangers 410 are not included.

Additionally, the synthetic jets 402 of the illustrated example are positioned on or above (e.g., directly in contact with an upper surface of) the heat spreader 404. The heat spreader 404 of the illustrated example is a plate capable of spreading heat generated by the processor 406 and/or other electronic components of the circuit board 408. In some examples, the heat spreader 404 can be a vapor chamber, a heat exchanger, a plate, a heat plate and/or any other heat spreader. In some examples, the heat spreader 404 is a planar heat pipe, which can spread heat in two dimensions (e.g., across a surface area of the vapor chamber). The heat spreader 404 of the illustrated example can be composed of brass, copper and/or any other suitable material(s) for transferring and/or spreading heat. The synthetic jets 402 of the illustrated example are positioned adjacent or laterally relative to (e.g., away from) the processor 406. In other words, the synthetic jets 402 are not positioned directly above the processor 406 in a stack-up direction or z-direction (e.g., FIG. 4C). In the illustrated example, the synthetic jets 402 are positioned adjacent lateral sides or edges 406*a* of the processor 406. For instance, the synthetic jets 402 are positioned at a location away from the processor 406 in the y-direction and/or the x-direction (e.g., not directly above the processor 406 in the z-direction).

Referring to FIGS. 4D-4E, the synthetic jets 402 of the illustrated example each have a body 412 defining a fluid passageway 414 between an inlet 416 and a first outlet 418 and a second outlet 420. A diaphragm or actuator 422 is positioned in the fluid passageway 414 of the body 412. The actuator 422 is actuated (e.g., via an electrical signal or command from the thermal management system 150) to induce fluid flow from the inlet 416 to the first outlet 418 and the second outlet 420.

Referring to FIGS. 4B-4E, the body 412 of the illustrated example has a rectangular shape that includes a first wall 423 (e.g., an upper or top wall), side walls 412*a* (e.g., four side walls), and a third wall 427 (e.g., a lower or bottom wall 412*c*) that define a cavity 412*b* to provide a portion of the fluid passageway 414. The first wall 423 of the body 412 includes a first aperture 423*a* to define the inlet 416, a second wall 425 (e.g., a front wall or one of the side walls 412*a*) includes a second aperture 425*a* to define the first outlet 418, and a third wall 427 defining the first opening 433 to provide the bypass 430 and/or the second outlet 420. The second wall 425 of the illustrated example is perpendicular relative to the first wall 423 and the third wall 427, and the first wall 423 is substantially parallel relative to the third wall 427.. The third wall 427 is oriented toward the first surface 404*a* of the heat spreader 404 and the second wall 425 is oriented in a direction away from the first surface 404*a* of the heat spreader 404.

The fluid passageway 414 of respective ones of the synthetic jets 402 of the illustrated example bifurcates or splits the airflow 424 in the fluid passageway 414. Specifically, the synthetic jets 402 and the heat spreader 404 define the fluid passageway 414 between the inlet 416 and the second outlet 420. For instance, an airflow 424 in the fluid passageway 414 that is received by the inlet 416 is separated or split into a first exhaust 426*a* and a second exhaust 426*b*. Specifically, the first exhaust 426*a* flows across the first surface 404*a* of the heat spreader 404 and the second exhaust 426*b* flows across the second surface 404*b* of the heat spreader 404. In particular, the second exhaust 426*b* flows through the heat exchanger 410 associated with or positioned adjacent the respective pair of the synthetic jets 402. In other words, the airflow 424 flows both above the heat spreader 404 (e.g., the first surface 404*a*) and below the heat spreader 404 (e.g., the second surface 404*b*).

Referring to FIG. 4D-4F, to split, divide or bifurcate the airflow 424 through the fluid passageway 414, the synthetic jet system 400 of the illustrated example employs a flow redistributor or bypass 430. The bypass 430 of the illustrated example communicatively and/or fluidly couples the first surface 404*a* of the heat spreader and the second surface 404*b* of the heat spreader 404. Thus, the bypass 430 bifurcates airflow from the inlet 416. To provide the bypass 430, the heat spreader 404 and the body 412 of a respective one of the synthetic jets 402 bifurcate airflow from the inlet 416 to the first outlet 418 and the second outlet 420. In particular, to bifurcate the airflow 424 into the first exhaust 426*a* and the second exhaust 426*b*, the body 412 includes a first opening 433 and the heat spreader 404 includes a second opening 436 (e.g., a second pass through aperture, hole, channel, slot, etc.) in communication with the fluid passageway 414 via the first opening 433 (e.g., a slot) formed in the body 412 of a respective one of the synthetic jets 402. The second opening 436 of the illustrated example is the opening of a hole 436*a* extending between the first surface 404*a* and the second surface 404*b*. Specifically, the first opening 433, the hole 436*a*, and the second opening 436 communicatively couple the first surface 404*a* of the heat spreader 404 and the second surface 404*b* of the heat spreader 404.

The bypass 430 of the illustrated example includes a gasket 432 (e.g., a heat exchanger bypass gasket duct) positioned (e.g., sandwiched) between the body 412 and the heat spreader 404. The gasket 432 of the illustrated example includes a slot 434 (e.g., a first pass through aperture, hole, channel, opening, etc.) to fluidly couple the first opening 433 and the second opening 436. The gasket 432 has a body or solid layer 432*a* that blocks part of first exhaust 426*a* flow from channeling through the bypass 430 and allows the first exhaust 426*a* to exit the first outlet 418. The gasket 432 and the heat spreader 404, via the bypass 430 formed by the first opening 433 and the second opening 436 allow the second exhaust 426*b* (e.g., a portion of the airflow 424) to flow through to the heat spreader 404 and to the heat exchanger 410. The second exhaust 426*b* exits the synthetic jet system 400 via the heat exchangers 410, enhancing overall cooling effectiveness of the synthetic jet system 400. In other words, the flow distribution provided by the bypass 430 improves overall thermal solution effectiveness. The bypass 430 (e.g., the opening or features provided by the heat spreader 404 and the gasket 432 allows airflow (e.g., the second exhaust 426*b*) for the heat exchanger 410 and allows airflow (e.g., the first exhaust 426*a*) to be exhaust through the first opening 433 and/or a vent of the housing 403 (FIG. 4A). In the illustrated example, a thermal conductive material or layer 438 (e.g., graphite) is positioned between the gasket 432 and the heat spreader 404 and/or on the second surface 404*b* of the heat spreader 404. The thermal conductive layer 438 dissipates and/or spreads heat from processor 406 to the heat spreader 404. Each of the layers 328 includes an openings 439 that aligns with the first opening 433 and the second opening 436 (e.g., and the slot 434) to allow the second exhaust 426*b* to flow between the first surface 404*a* and the second surface 404*b* of the heat spreader 404. A thermal interface material (TIM) 435 (e.g., a thermal pad, silicon material, thermal gap filler, etc.) is positioned between the synthetic jets 402 and the heat spreader 404. In some examples, the layers 438 are not included. In some examples, one of the layers 438 is provided only on the first surface 404*a* or the second surface 404*b* of the heat spreader 404. In the illustrated example, the synthetic jet system 400 includes a duct 441 to channel the second exhaust 426*b* to the heat exchanger 410. However, in some examples, the duct 441 is not provided.

Referring to FIGS. 4A-4F, in operation, the synthetic jets 402, via actuation of the actuator 422 in the body 412, generate a suction at the inlet 416 to draw airflow 424 into the inlet 416 and the fluid passageway 414. The actuator 422 creates a pressure differential (e.g., a suction or vacuum at the inlet 416) in the fluid passageway 414 to cause the airflow 424 to flow toward the first outlet 418 and the second outlet 420 via the fluid passageway 414 and the bypass 430. Additionally, the airflow 424 at the inlet 416 is air received from above the first surface 404*a* of the heat spreader 404 (e.g., heat generated from the processor 406 that is spread via the heat spreader 404). Thus, the position and/or location of the synthetic jets 402 adjacent the processor 406 enables heated air directly above the processor 406 to be pulled away from the processor 406 and toward the inlets 416 of the synthetic jets 402. The airflow 424, which includes heated air generated from the processor 406 and dissipated by the heat spreader 404, flows through the synthetic jets 402 and bifurcates into the first exhaust 426*a* and the second exhaust 426*b*, thereby removing the heat from the processor 406 and/or a processor zone 411 (e.g., a system on chip (SoC) area) and/or cooling a hot spot region (e.g., the hot spot zone 202 of FIG. 2). As noted, the example synthetic jet system 400 of the illustrated example bifurcates or otherwise separates the airflow 424 from the inlet 416 into at least two separate airflow streams (e.g., the first exhaust 426*a* and the second exhaust 426*b*). In other words, the first exhaust 426*a* exits the first outlet 418 of the synthetic jets 402, and a second exhaust 426*b* is directed underneath the heat spreader 404 and toward the heat exchanger 410. By redistributing the flow, a greater amount of airflow or air mass can be moved from an area adjacent the processor 406 processor, which increases significantly synthetic jet cooling capability or characteristics. In some examples, the synthetic jets 402 increase cooling capability by as much as 40% compared to jets that do not have bifurcated flow paths.

In some instances, the first exhaust 426*a* can exit the first outlet 418 and vents from the housing 403 of the electronic device 401. In this example, the second exhaust 426*b* flows through the heat exchanger 410, which reduces or cools (e.g., remove heat from) the second exhaust 426*b*. The second exhaust 426*b* exiting the heat exchanger 410 can be directed or redirected to flow is directed toward the hot spot region, thereby cooling a hot spot region (e.g., the hot spot zone 202 of FIG. 2), and/or the processor to further cool the processor.

Further, in some examples, a first portion of the heat spreader 404 on which the synthetic jets 402 are positioned can have an offset elevation (e.g., in the z-direction of FIG. 1A) relative to a second portion of the heat spreader 404 that is above the processor 406. For instance, a first upper surface of the first portion of the heat spreader 404 can be at a lower elevation relative to a second upper surface of the second portion of the heat spreader. In this manner, a greater gap is provided between a cover (e.g., a cover or skin of the first housing 102 of FIG. 1A) and the inlets of the synthetic jets 402, enabling greater airflow towards inlets. In other words, if the synthetic jets 402 are positioned on the second portion directly above the processor, a gap (e.g., in the vertical or z-direction in the orientation of FIG. 1A) formed between the inlet and a cover of a housing (e.g., the first housing 102 of FIG. 1A) of an electronic device may be small and/or otherwise imped airflow to the inlets of the synthetic jets 402. In some examples, the inlet 416 can be provided on a side surface of the body 412 (on a surface perpendicular to a surface on which the inlet 416 is formed in FIGS. 4B and 4C).

Figures 5A, 5B:
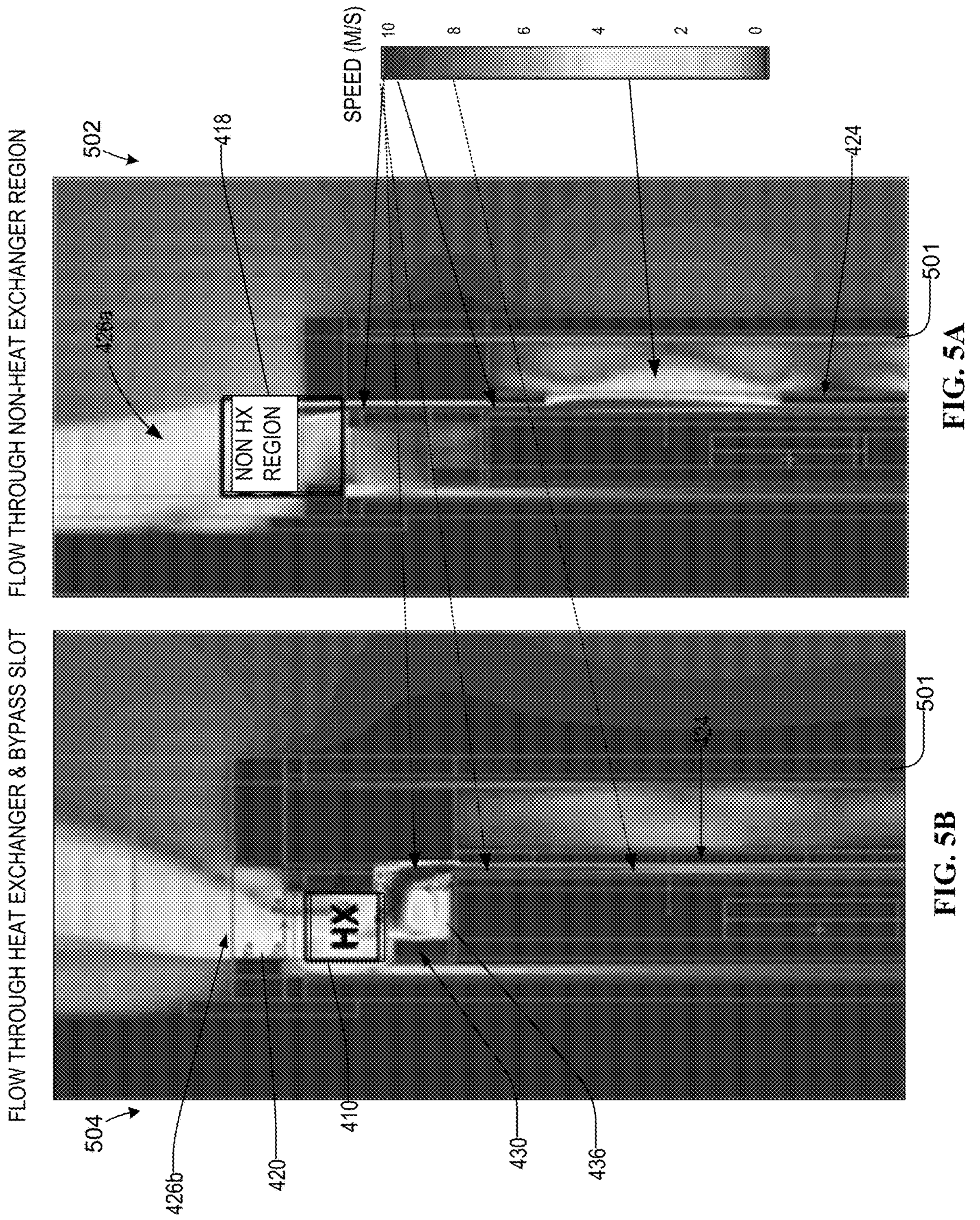
FIGS. 5A and 5B are illustrate example velocity maps of an example first exhaust flow flowing through an example first outlet of an example jet, and an example second exhaust flow flowing through an example second outlet of the example jet, respectively.

FIG. 5A is an infrared velocity map 502 of the first exhaust 426*a* flowing through a synthetic jet 501 (i.e., a respective one) of the synthetic jets 402 and to the first outlet 418. FIG. 5B is an infrared velocity map 504 of the second exhaust 426*b* flowing through the synthetic jet 501 and to the second outlet 420. Referring to FIG. 5A, the velocity of the second exhaust 426*b* flowing through the bypass 430 at to the heat exchanger 410 is approximately 10 meters/second (m/s). Similarly, the first exhaust 426*a* flows through the first outlet 418 is approximately 10 m/s. The example synthetic jet system 400 increased cooling capability by 40 percent by redistributing the airflow 424 into the first exhaust 426*a* and the second exhaust 426*b*. In some examples, the first exhaust 426*a* can have a greater mass flow rate and/or velocity than a mass flow rate or velocity of the second exhaust 426*b*. In some examples, the second exhaust 426*b* can have a greater mass flow rate and/or velocity than a mass flow rate or velocity of the first exhaust 426*a*. In some examples, the first exhaust 426*a* can have a mass flow rate and/or velocity that is substantially similar or identical to a mass flow rate or velocity of the second exhaust 426*b*.

In some examples, the synthetic jets 402 can have different orientations. For example, the first outlet 418 and the second outlet 420 can be positioned in directions perpendicular to each other. In some examples, the first outlet 418 can be oriented substantially perpendicular or non-parallel relative to the second outlet 420. Thus, the first exhaust 426*a* can be oriented in a first direction, and the second exhaust 426*b* can be oriented in a second direction different than (e.g., perpendicular to) the first direction. In some examples, the synthetic jets 402 can have any other orientation such that the exhausts 426*a*, 426*b* blow outwards, blowing inwards toward the processor 406, a combination of inwards and outwards, in a horizontal direction relative to an upper surface of the circuit board 408, in vertical direction relative to the circuit board 408, and/or any other direction(s). In some examples, the synthetic jets 402 can be oriented and/or configured for different types of cooling: impingement flow; as flow mover; combination of impingement and flow mover, etc. This can be useful under various inlet(s) location (s) (e.g., D-cover, C-cover, side walls) and heat exchanger location(s) (e.g., rear, side etc.). In some examples, the heat exchangers 410 can be omitted and/or replaced with different spreaders (e.g., a heat pipe, a vapor chamber, a copper plate, a copper and graphite plate, high thermal conductivity material(s), etc.). In some examples, the synthetic jets 402 can be stacked on top of each other or can be single stack as shown in FIG. 4A. In some examples, the synthetic jet system 400 of the illustrated example can be located in the first housing 102 of FIG. 1, the second housing 104 of FIG. 1 and/or any other location(s).

FIGS. 6A-14C illustrate other example electronic devices 601, 701, 801, 901, 1001, 1101, 1201, 1301, 1401 that include other example synthetic jet systems 600, 700, 800, 900, 1000, 1100, 1200, 1300, 1400 disclosed herein. The example synthetic jet systems 600, 700, 800, 900, 1000, 1100, 1200, 1300, 1400 can implement the electronic device 100 of FIG. 1, a tablet, a laptop, a desktop, a mobile device, and/or any other electronic device that employs thermal management systems. M any of the components of the example synthetic jet systems 600, 700, 800, 900, 1000, 1100, 1200, 1300, 1400 are substantially similar or identical to the components described above in connection with FIGS. 1A-1D, 2, 3, 4A-4F, 5A and 5B. As such, those components will not be described in detail again below. Instead, the interested reader is referred to the above corresponding descriptions for a complete written description of the structure and operation of such components. To facilitate this process, similar or identical reference numbers will be used for like structures in FIGS. 6A-12C as used in FIGS. 1A-1D, 2, 3, 4A-4F, 5A and 5B. For example, the electronic devices 601, 701, 801, 901, 1001, 1101, 1201, 1301, 1401 include a processor 406 and a circuit board 408. The examples of FIGS. 6A-14C illustrate different configurations and/or orientations of the synthetic jet systems 600, 700, 800, 900, 1000, 1100, 1200, 1300, 1400 relative to the processor 406 and the circuit board 408.

Figure 6A:
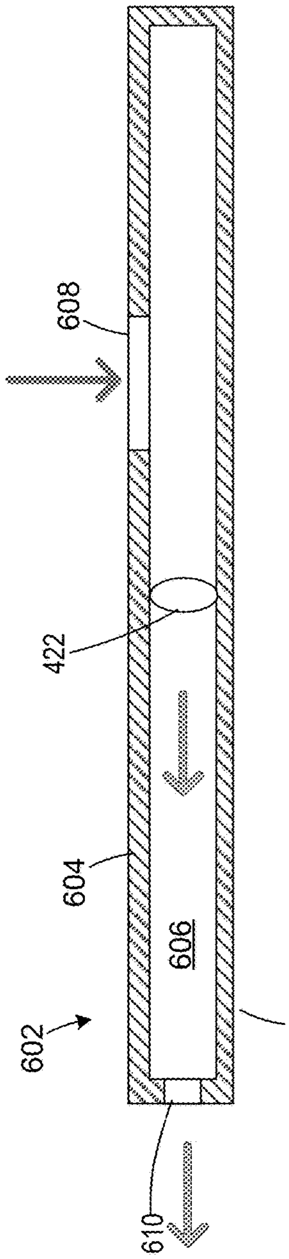
FIGS. 6A-6D illustrate other example synthetic jet system disclosed herein.

FIG. 6A is a cross-sectional view of another example synthetic jet 602 disclosed herein. The synthetic jet 602 of the illustrated example includes a body 604 defining a fluid passageway 606 between an inlet 608 and an outlet 610. Unlike the synthetic jets 402 of FIGS. 4A-4F, the synthetic jet 602 of the illustrated example does not include a bypass 430 as shown in FIGS. 4A-4F. In other words, the synthetic jet 602 of FIG. 6A is a unitary flow path (e.g., a single outlet similar to the first outlet 418 of FIGS. 4A-4E). A bottom surface 611 of the body 604 mounts or couples to a heat spreader and/or other structure of an electronic device.

Each of the example synthetic jet systems 600, 700, 800, 900, 1000, 1100, 1200, 1300, 1400 of FIGS. 6B-14C include a plurality of synthetic jets 602. However, in some examples, the synthetic jet systems 600, 700, 800, 900, 1000, 1100, 1200, 1300, 1400 of FIGS. 6B-14C can be configured with a plurality of synthetic jets 402 of FIGS. 4A-4E. For example, the plurality of synthetic jets 402 can replace the plurality of synthetic jets 602 as shown in FIGS. 6B-14C. In some examples, the synthetic jet systems 400, 600, 700, 800, 900, 1000, 1100, 1200, 1300, 1400 disclosed herein can be configured with both the synthetic jets 402 and the synthetic jets 602. Additionally, some examples shown herein include a certain number of synthetic jets 602 (e.g., four synthetic jets, eight synthetic jets, etc.). However, any number of synthetic jets can be used (e.g., less than four, five, six, more than eight, etc.).

Figure 6B:
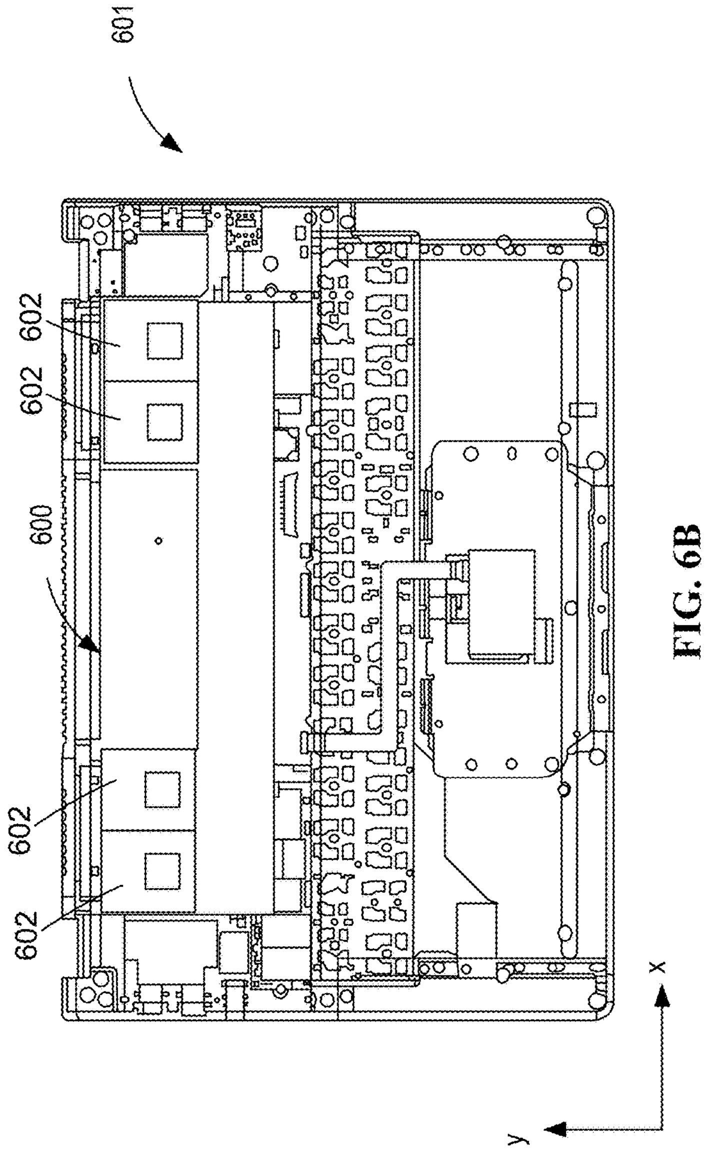
Figure 6C:
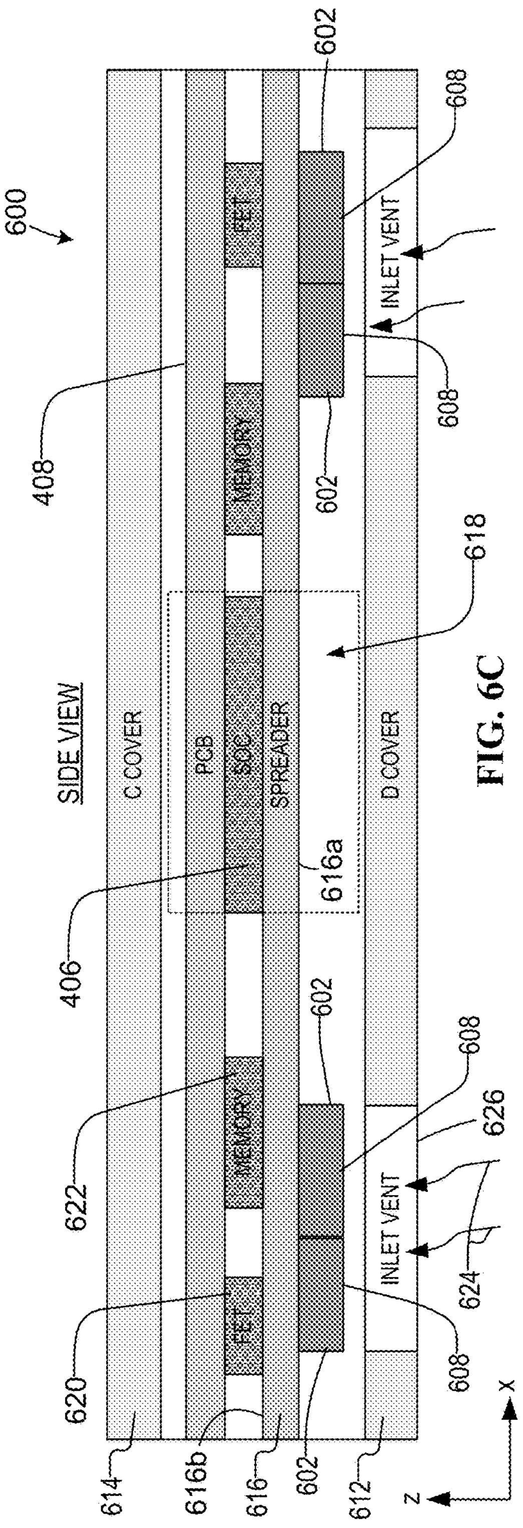
Figure 6D:
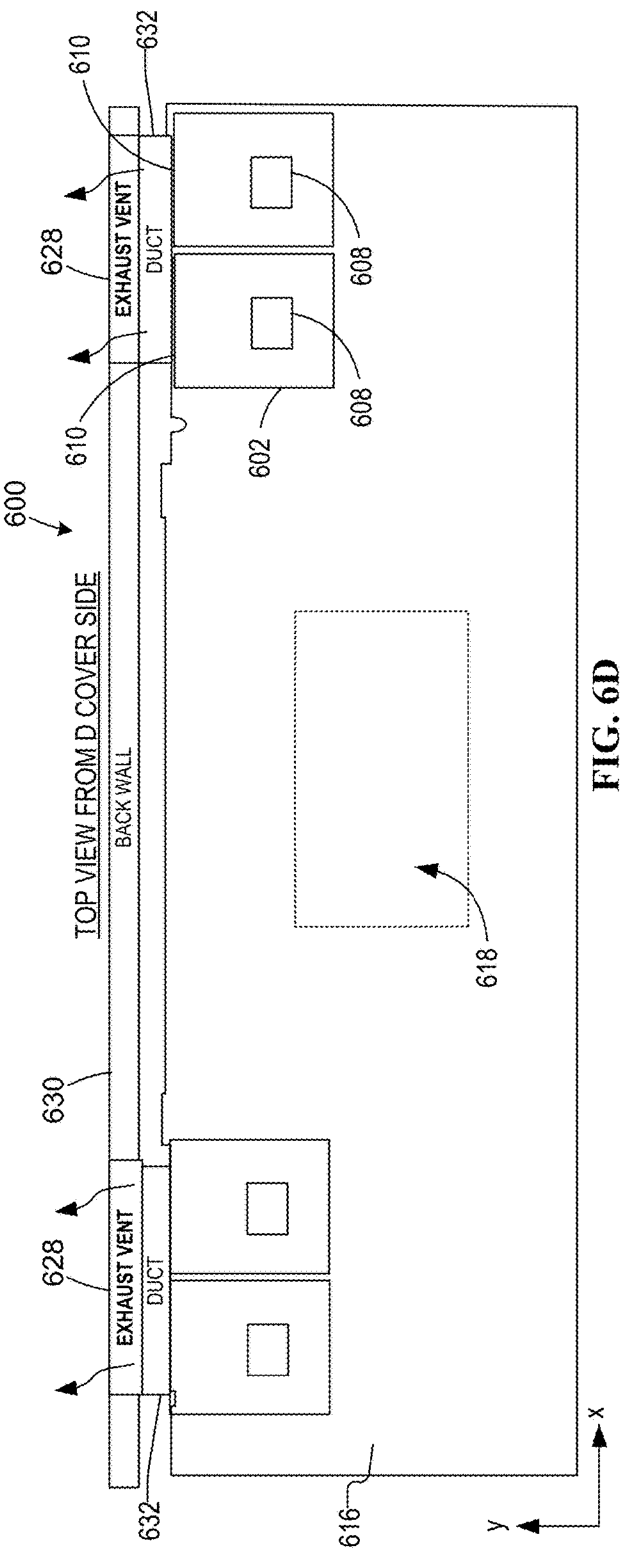

FIG. 6B is rear side view of an example electronic device 601 including another example synthetic jet system 600 disclosed herein. A first cover 612 (e.g., a D-cover or bottom cover) (FIG. 6C) is removed for clarity. FIG. 6C is a bottom view from the first cover 612 (e.g., a D cover side, which is not shown in FIG. 6C for clarity) of the example synthetic jet system 600. FIG. 6D is a bottom view of the example synthetic jet system 600. The first cover 612 is not shown in FIGS. 6B and 6C for clarity.

Referring to FIG. 6C and, the electronic device 601 includes the printed circuit board 408 and the processor 406 positioned between the first cover 612 (e.g., a D-cover or bottom cover or frame) and a second cover 614 (e.g., a C-cover or top cover or frame). The example synthetic jet system 600 includes a plurality of synthetic jets 602 (e.g., four jets) coupled to a heat spreader 616. Specifically, the synthetic jets 602 are positioned on a first surface 616*a* and the processor 406 is oriented toward (e.g., or, alternatively, coupled to) a second surface 616*b* of the heat spreader 616. Thus, the synthetic jets 602 are positioned between the first surface 616*a* of the heat spreader 616 and the first cover 612 and the processor 406 is positioned between the circuit board 408 and the second surface 616*b* of the heat spreader 616. Additionally, the synthetic jets 602 are positioned away from a processor zone 618 (e.g., a core region of processor 406). For example, the processor zone 618 can be defined by a perimeter of the processor 406, where a boundary or zone defined by the perimeter of the processor 406 extends (e.g., vertically) between the first cover 612 and the second cover 614. The heat spreader 616 of the illustrated example is extended for non-system on chip (non-SOC) component cooling (e.g., FET 620, memory 622, etc.). In operation, airflow 650 (e.g., cool air) flows in the inlet 608 of the respective ones of the synthetic jets 602 via inlet vents 626 formed in the first cover 612 and exits from the outlet 610 of the respective ones of the synthetic jets 602. Airflow or exhaust exiting the outlet 610 impinges on the heat spreader 616 as it exits the synthetic jets 602 and exits through exhaust vents 628 formed in a back wall 630 (e.g., a side wall) of the electronic device 601. In some examples, duct 632 (e.g., downstream from the outlet 610) fluidly couples the outlets 610 and the exhaust vents 628. Thus, in the illustrated example, the outlets 610 are directed away from the processor 406 and/or the processor zone 618 (e.g., a core region) and synthetic jets 602 provide cooling for non-system on chip components (e.g., FET 620, memory 622, etc.).

Figure 7A:
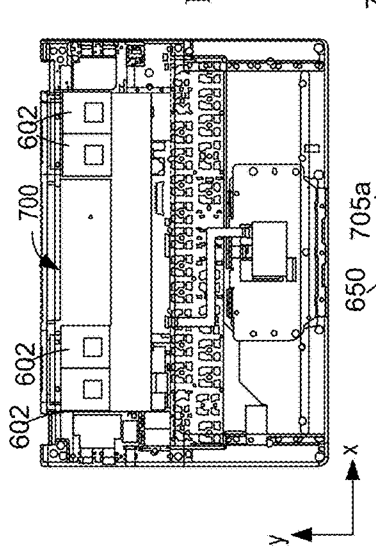
FIGS. 7A-7C illustrate other example synthetic jet system disclosed herein.
Figure 7B:
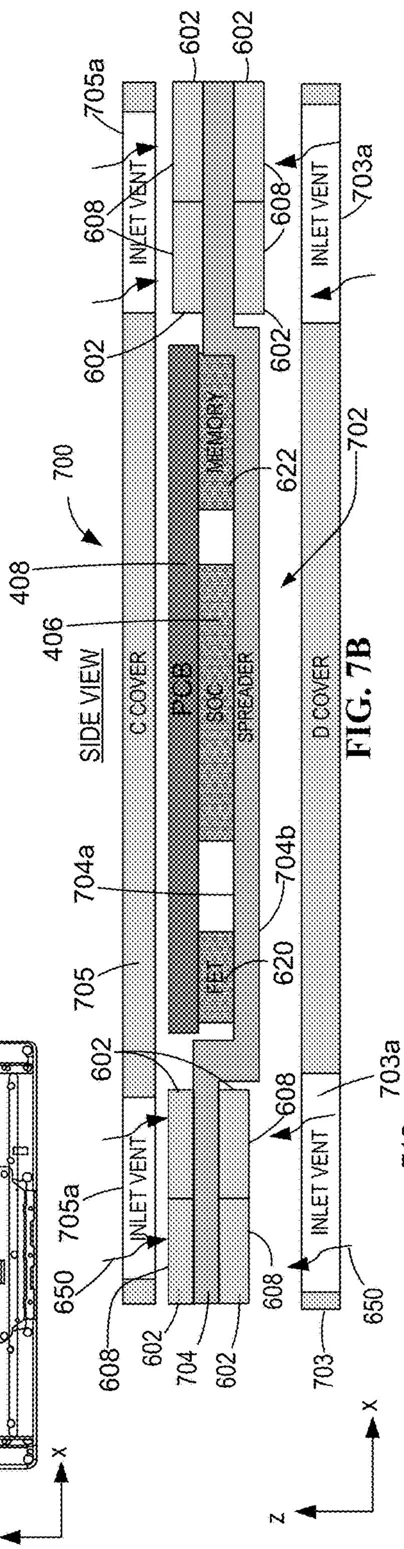
Figure 7C:
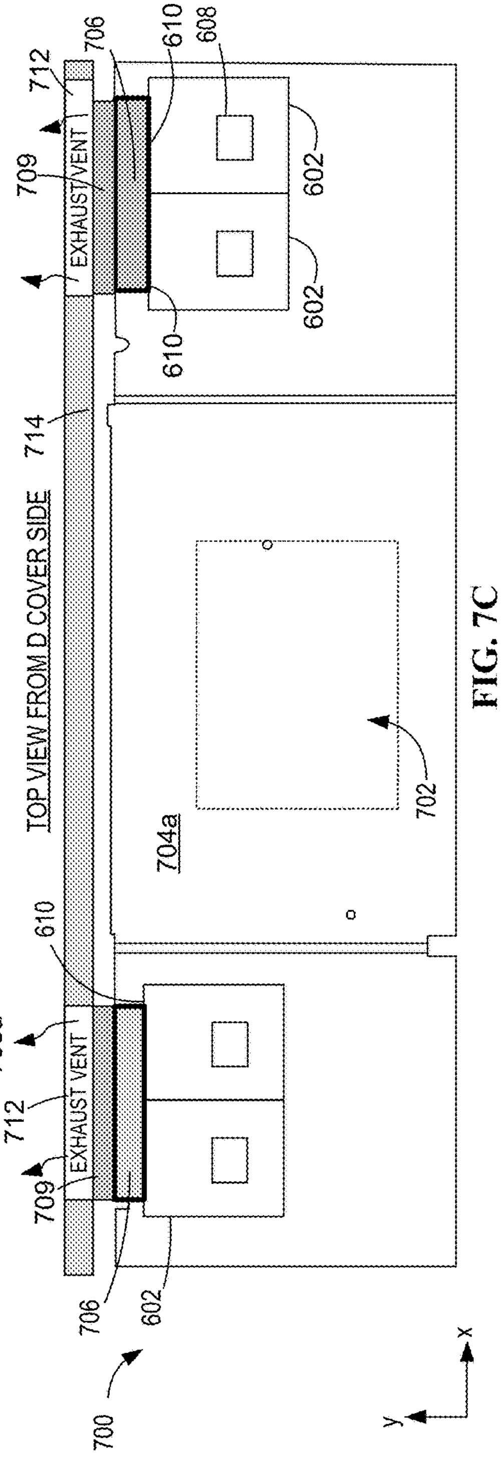

FIG. 7A is a bottom view of an example electronic device 701 including another example synthetic jet system 700 disclosed herein. FIG. 7B is a rear side view of the example synthetic jet system 700. FIG. 7C is a bottom view of the example synthetic jet system 700 of FIG. 7A. Referring to FIGS. 7B and 7C, the electronic device 701 includes the printed circuit board 408 and the processor 406 positioned between a first cover 703 (e.g., a D-cover or bottom cover or frame) and a second cover 705 (e.g., a C-cover or top cover or frame). The first cover 703 is not shown in FIGS. 7A and 7C for clarity. The example synthetic jet system 700 includes a plurality of synthetic jets 602 (e.g., eight jets) coupled to a heat spreader 704. In particular, the synthetic jets 602 (e.g., eight jets) of the illustrated example are positioned on both sides of a heat spreader 704 (e.g., a first side 704*a* and a second side 704*b* opposite the first side). In the illustrated example, a first plurality of synthetic jets 602 (e.g., four jets) are positioned on the first side 704*a* and a second plurality of synthetic jets 602 (e.g., four jets) are positioned on the second side 704*b* opposite the first side 704*a*. The synthetic jets 602 are placed in an evacuative layout away from a processor zone 702 (e.g., a system on chip (SoC) zone) and/or the processor 406 such that the synthetic jets 602 are not positioned directly over the processor 406 (e.g., in the z-direction or stack-up direction) but are positioned on lateral sides of the processor zone 702 and/or the processor 406. Thus, the heat spreader 704 is an extended spreader for non-SOC component cooling. In other words, the outlets 610 of the synthetic jets 602 are oriented in a direction away from the processor 406 (e.g., toward a back wall 707 of the electronic device 701).

In operation, airflow 650 is drawn into the inlets 608 of the synthetic jets 602 via inlet vents 703*a* formed in the first cover 703 and/or inlet vents 705*a* formed in the second cover 705. As air exits the outlets 610 of the synthetic jets 602, air exiting the outlets 610 impinges the heat spreader 704. Additionally, the synthetic jet system 700 of the illustrated example includes a heat exchanger 706 in communication with the outlets 610 of the respective ones of the synthetic jets 602. The synthetic jet system 700 can include a duct 709 to channel the airflow from the heat exchanger 706 to an exhaust vent 712 formed in a back wall 714 (e.g., a side wall) of the electronic device 701. The heat exchanger 706 can be added on either of the first side 704*a* or the second side 704*b* of the heat spreader 704 based on system design feasibility. The outlets 610 of the example synthetic jets 602 of FIGS. 7A-7C are directed away from the processor 406. Thus, in the illustrated example, the outlets 610 are directed away from the processor 406 and/or the processor zone 702 and can effectively cool non-system on chip components (e.g., FET 620, memory 622, etc.).

Figure 8A:
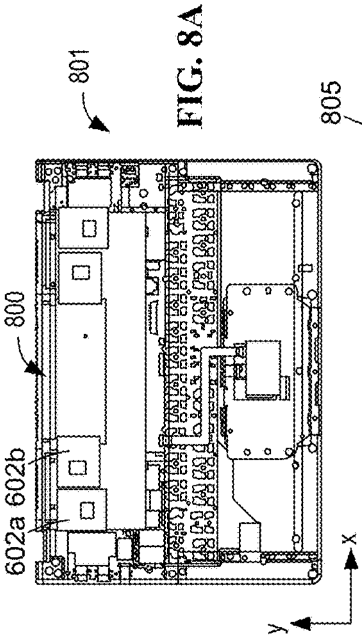
FIGS. 8A-8C illustrate other example synthetic jet system disclosed herein.
Figure 8B:
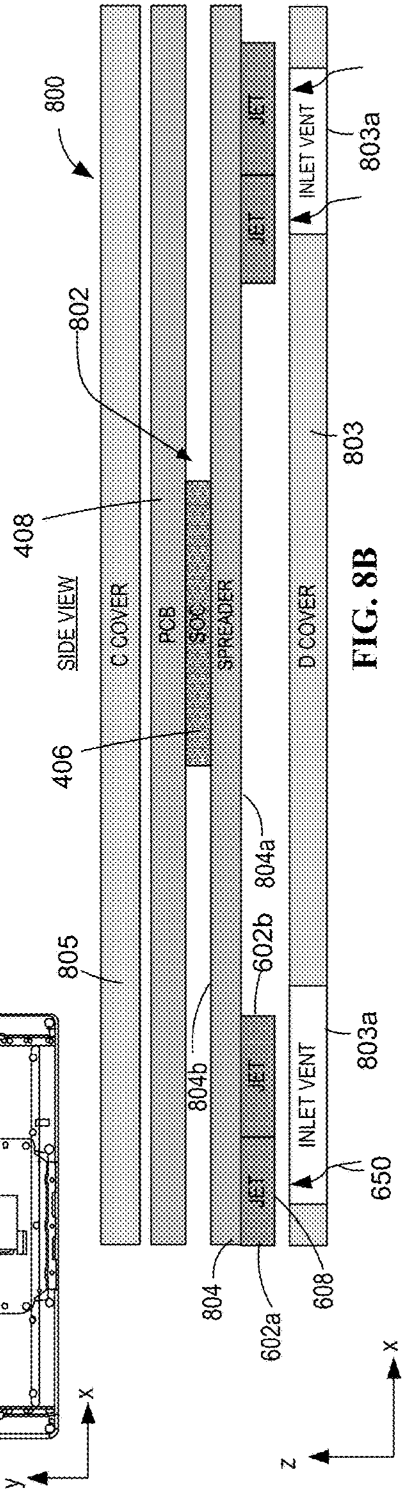
Figure 8C:
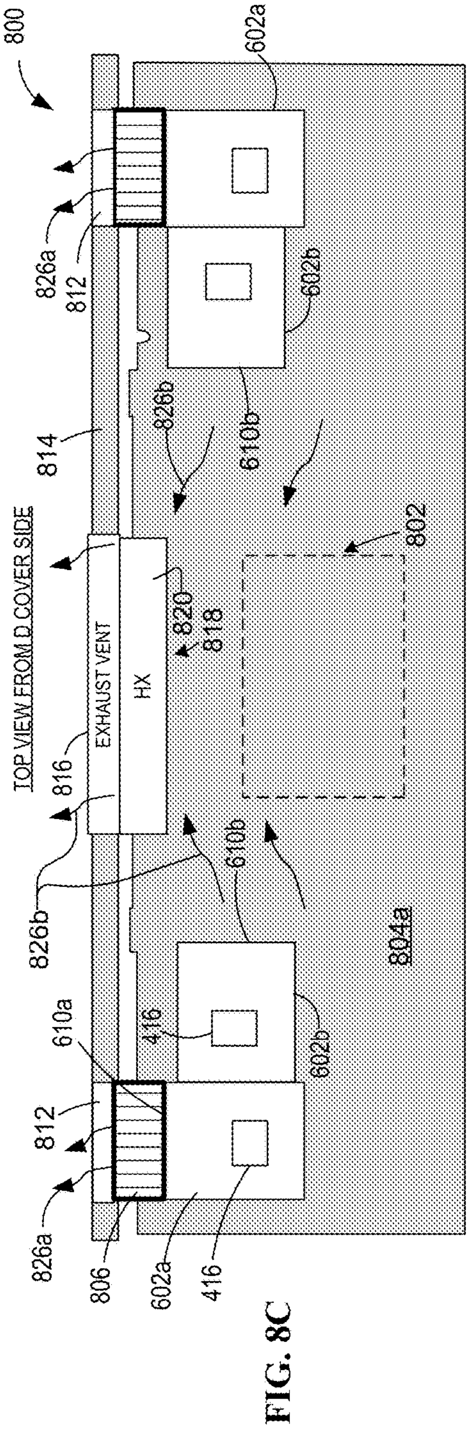

FIG. 8A is a bottom view of an example electronic device 801 including another example synthetic jet system 800 disclosed herein. FIG. 8B is a rear side view of the example synthetic jet system 800. FIG. 8C is a bottom view from a first cover 803 (e.g., a D cover side) of the example synthetic jet system 800. Referring to FIGS. 8B and 8C, the electronic device 801 includes the printed circuit board 408 and the processor 406 positioned between the first cover 803 (e.g., a D-cover or bottom cover or frame) and a second cover 805 (e.g., a C-cover or top cover or frame). The first cover 803 is not shown in FIGS. 8A and 8C for clarity. The example synthetic jet system 800 includes a plurality of synthetic jets 602 (e.g., four jets) coupled to a first side 804*a* of a heat spreader 804 opposite a second side 804*b*, where the second side 804*b* is oriented toward the processor 406. The synthetic jet system 800 of the illustrated example includes a first set of jets 602*a* and a second set of jets 602*b* placed in different orientations (e.g., an ester island layout). For example, the first set of jets 602*a* are oriented non-parallel (e.g., perpendicular) relative to the second set of jets 604*a*. M ore specifically, respective first outlets 610*a* of the first set of jets 602*a* are positioned non-parallel (e.g., perpendicular) relative to respective second outlets 610*b* of the second set of jets 602*b*. In particular, the first outlets 610*a* of the first set of jets 602*a* are oriented or directed toward a back wall 814 of the electronic device 801 and the second outlets 610*b* of the second set of jets 602*b* are oriented toward the processor 406 and/or a processor zone 802. In the illustrated example, exhaust 826*a* exiting the first outlets 610*a* of the first set of jets 602*a* is non-parallel (e.g., perpendicular) relative to exhaust 826*b* exiting the second outlets 610*b* of the second set of jets 602*b*. In operation, the first set of jets 602*a* and the second set of jets 602*b* draw airflow 650 into the inlets 608 via inlet vents 703*a* of the first cover 703. Airflow or exhaust 826*a* exits the first outlets 610*a*, flows across the heat exchangers 806, and through exhaust vents 812 of the back wall 814 (e.g., for non-SOC component cooling). Additionally, airflow or exhaust 826*b* exits the second outlets 610*b* of the second set of jets 602*b* and impinges on and/or flows over the heat spreader 804 across the processor zone 802 (e.g., the SoC components). The exhaust 826*b* and exits through an exhaust vent 816 of a central system 818 (e.g., an exhaust system for the processor zone 802) formed in the back wall 814. The central system 818 can include a heat exchanger 820.

Figure 9A:
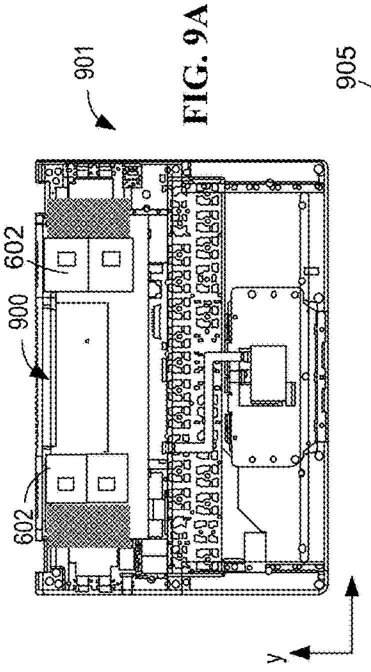
FIGS. 9A-9C illustrate other example synthetic jet system disclosed herein.
Figure 9B:
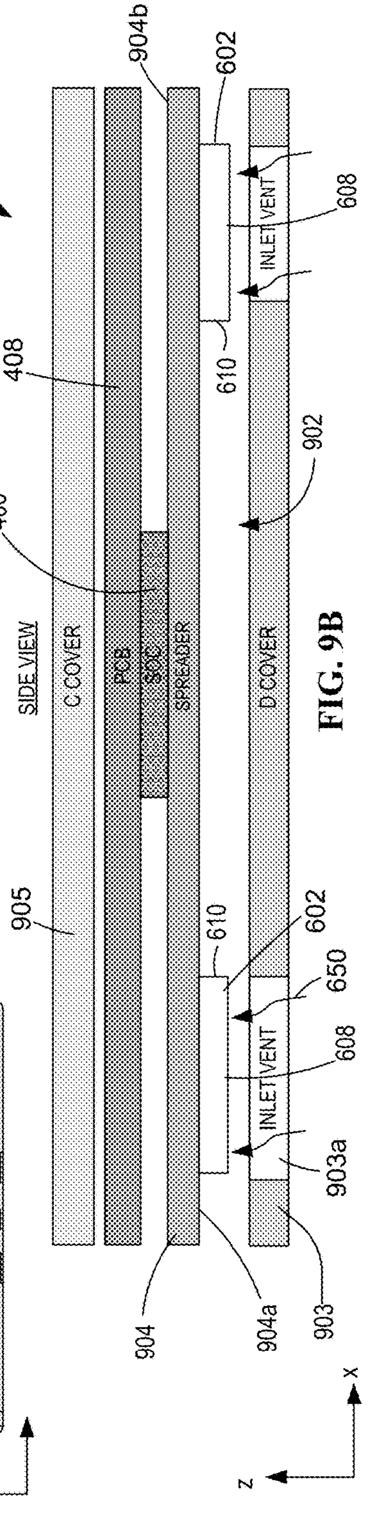
Figure 9C:
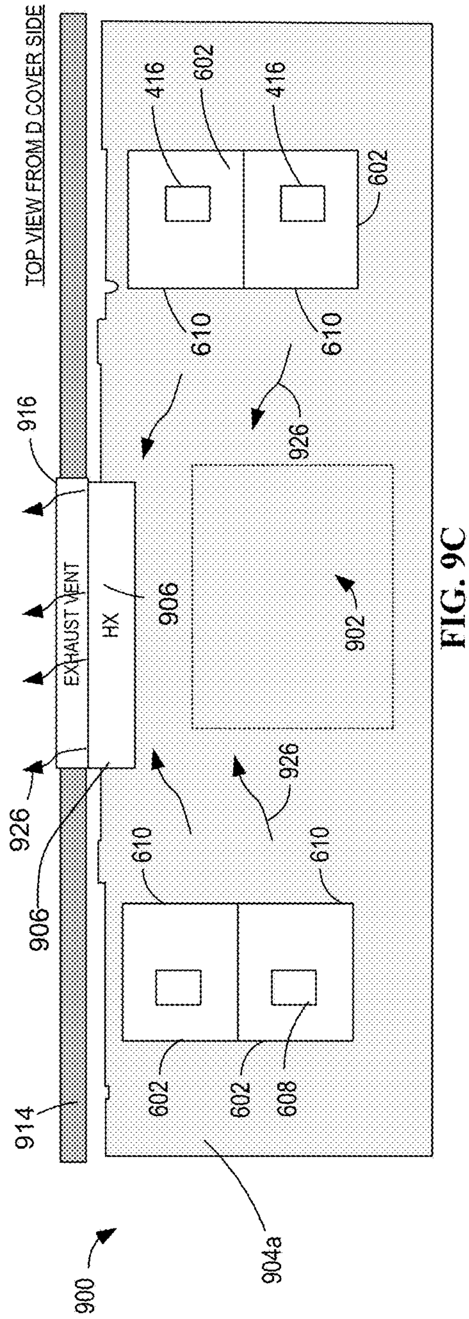

FIG. 9A is a bottom view of an example electronic device 901 including another example synthetic jet system 900 disclosed herein. FIG. 9B is a side view of the example synthetic jet system 900. FIG. 9C is a bottom side view from a first cover 903 (e.g., a D cover side) of the example synthetic jet system 900. Referring to FIGS. 9B and 9C, the electronic device 901 includes the printed circuit board 408 and the processor 406 positioned between the first cover 903 (e.g., a D-cover or bottom cover or frame) and a second cover 905 (e.g., a C-cover or top cover or frame). The first cover 903 is not shown in FIGS. 9A and 9C for clarity. The example synthetic jet system 900 includes a plurality of synthetic jets 602 (e.g., four jets) coupled to a first side 904*a* of a heat spreader 904 opposite a second side 904*b*. The first side 904*a* of the heat spreader 904 is oriented toward the first cover 903 and the second side 904*b* is oriented toward the processor 406. The synthetic jet system 900 includes a plurality of synthetic jets 602 (e.g., four jets) positioned on the first side 904*a* of a heat spreader 904 opposite a second side 904*b* having the processor 406 (SoC). Specifically, the outlets 610 of respective ones of the synthetic jets 602 are oriented toward the processor 406 and/or a processor zone 902 (e.g. an SoC zone) of the heat spreader 904. The synthetic jets 602 of the illustrated example are placed in Hyperbaric Layout away from processor zone 902, but the outlets 610 are oriented to direct the airflow 926 toward the processor zone 902. In operation, airflow 650 (e.g., cool air) flows in the inlet 608 of the respective ones of the synthetic jets 602 via inlet vents 903*a* formed in the first cover 903 and exits from the outlet 610 of the respective ones of the synthetic jets 602. Airflow 926 exiting the outlets 610 impinges on the heat spreader 904 as the airflow flows across the processor zone 618. The airflow 926 exits the electronic device 901 through an exhaust vent 916 formed in a back wall 914 (e.g., a side wall) of the electronic device 901. A heat exchanger 906 is provided downstream from the outlets 610 and upstream from the exhaust vent 916. Thus, in the illustrated example, the outlets 610 are directed toward from the processor 406 and/or the processor zone 902 to cool the processor 406.

Figures 10A, 10B, 10C:
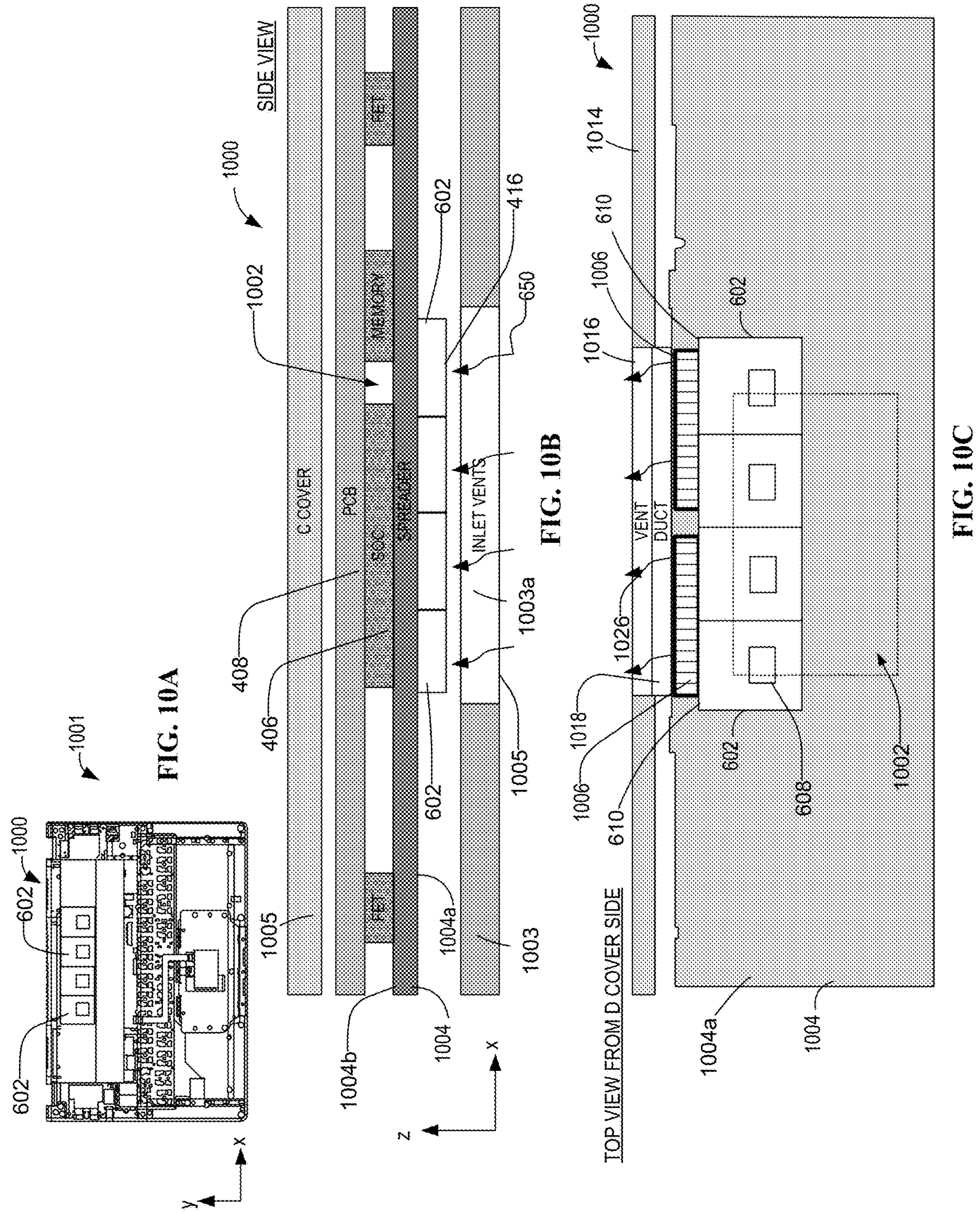
FIGS. 10A-10C illustrate other example synthetic jet system disclosed herein.

FIG. 10A is a bottom view of an example electronic device 1001 including the example synthetic jet system 1000 disclosed herein. FIG. 10B is a rear side view of the example synthetic jet system 1000. FIG. 10C is a bottom side view of the example synthetic jet system 1000. Referring to FIGS. 10B and 10C, the electronic device 1001 includes the printed circuit board 408 and the processor 406 positioned between a first cover 1003 (e.g., a D-cover or bottom cover or frame) and a second cover 1005 (e.g., a C-cover or top cover or frame). The first cover 1003 is not shown in FIGS. 10A and 10C for clarity. The example synthetic jet system 900 includes a plurality of synthetic jets 602 (e.g., four jets)

coupled to a first side 1004*a* of a heat spreader 1004 opposite a second side 1004*b*. The first side 1004*a* of the heat spreader 1004 is oriented toward the first cover 1003 and the second side 1004*b* is oriented toward the processor 406. The synthetic jets 602 (e.g., four jets) of the illustrated example are positioned adjacent (e.g., above or below) the processor 406 and/or the processor zone 1002. In other words, the synthetic jets 602 of the illustrated example are positioned on the first side 1004*a* of the heat spreader 1004 at least partially overlapping a perimeter of the processor 406 on the second side 1004*b* of the heat spreader 1004. In operation, airflow 650 enters the inlets 608 of the respective synthetic jets 602 via an inlet vent 1003*a* formed in the first cover 1003. As the airflow 1026 exits the outlets 610, the air impinges and/or flows across the heat spreader 1004 and exits through a vent 1016 of a central system 1008 formed in a back wall 1014 of the electronic device 1001. Heat exchangers 1006 is provided at the outlets 610 of the synthetic jets 602. A duct 1018 is provided between the heat exchangers 1006 and the vent 1016. In this example, each outlet 610 of the synthetic jets 602 is directed toward the heat exchangers 1006. Thus, in the illustrated example, although the outlets 610 are not directed or oriented toward the processor 406, the synthetic jets 602 are positioned to overlap (e.g., are positioned over or below) the processor 406 to cool the processor 406.

Figures 11A, 11B, 11C:
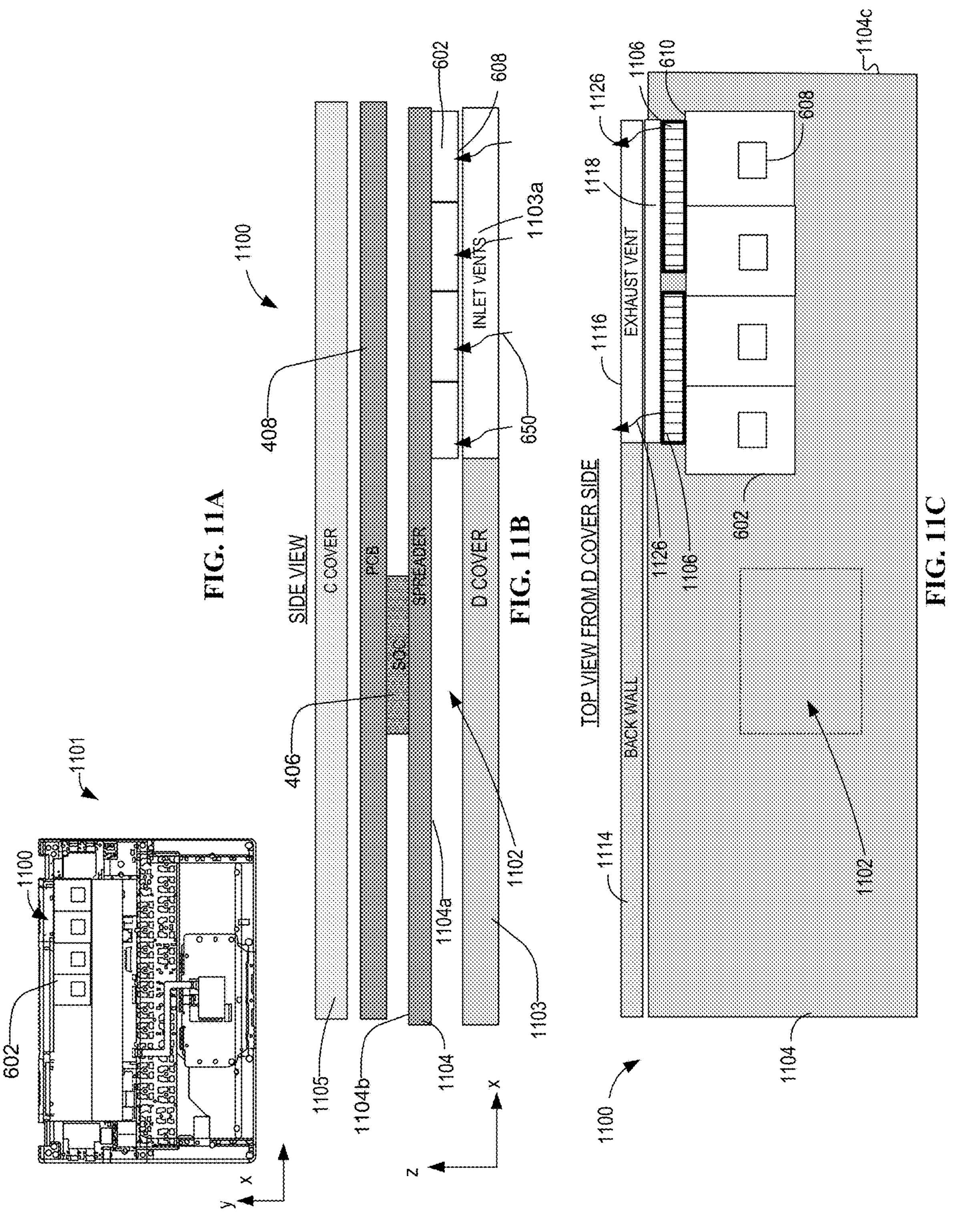
FIGS. 11A-11C illustrate other example synthetic jet system disclosed herein.

FIG. 11A is a bottom view of an example electronic device including another example synthetic jet system 1100 disclosed herein. FIG. 11B is a rear side view of the example synthetic jet system 1100. FIG. 11C is a bottom view of the example synthetic jet system 1100. Referring to FIGS. 11B and 11C, the electronic device 1101 includes the printed circuit board 408 and the processor 406 positioned between a first cover 1103 (e.g., a D-cover or bottom cover or frame) and a second cover 1105 (e.g., a C-cover or top cover or frame). The first cover 1103 is not shown in FIGS. 11A and 11C for clarity. The example synthetic jet system 1100 includes a plurality of synthetic jets 602 (e.g., four jets) coupled to a first side 1104*a* of a heat spreader 1104 opposite a second side 1104*b*. The first side 1104*a* of the heat spreader 1104 is oriented toward the first cover 1103 and the second side 1104*b* is oriented toward the processor 406. The synthetic jet system 1100 of the illustrated example includes a plurality of synthetic jets 602 (e.g., four synthetic jets) placed away from the processor 406 and on only one side of processor 406 or the processor zone 1102. For example, the synthetic jets 602 are positioned adjacent a lateral edge 1104*c* (e.g., a side edge, a right side edge in the orientation of FIG. 10C). In some examples, the synthetic jets 602 are positioned on the second side 1104*b* of the heat spreader 1104 (e.g., on the same side as the processor 406). In operation, airflow 650 enters the inlets 608 of the respective synthetic jets 602 via an inlet vent 1103*a* formed in the first cover 1103. The airflow 1126 exits the outlets 610 exits through a vent 1116 formed in a back wall 1114 of the electronic device 1101. Heat exchangers 1106 are provided at the outlets 610 of the synthetic jets 602. A duct 1118 is provided between the heat exchangers 1006 and the vent 1016.

Figures 12A, 12B, 12C:
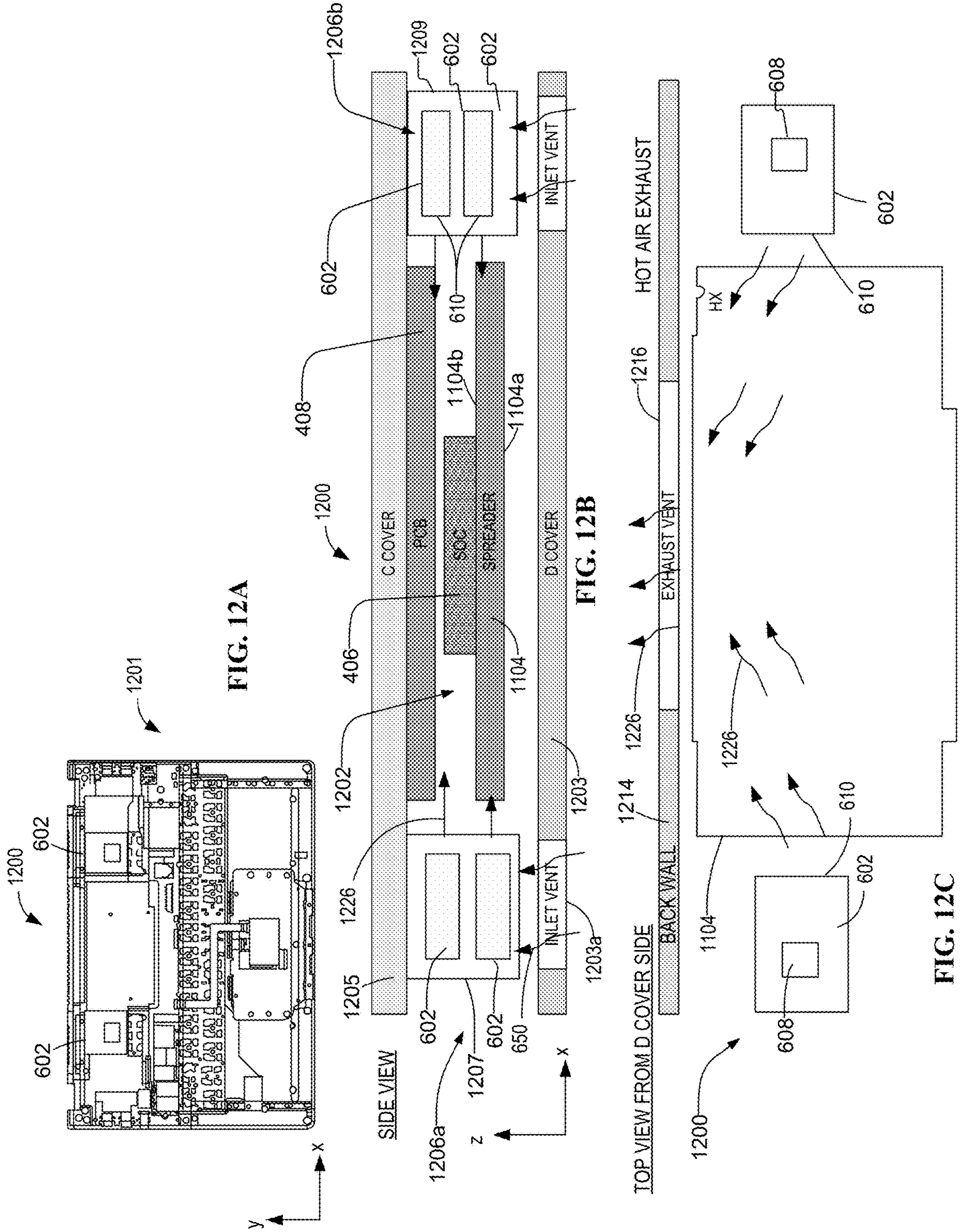
FIGS. 12A-12C illustrate other example synthetic jet system disclosed herein.

FIG. 12A is a bottom view of an example electronic device 1201 including another example synthetic jet system 1200 disclosed herein. FIG. 12B is a rear side view of the example synthetic jet system 1200. FIG. 12C is a front view of the example synthetic jet system 1200. Referring to FIGS. 12B and 12C, the electronic device 1201 includes the printed circuit board 408 and the processor 406 positioned between a first cover 1203 (e.g., a D-cover or bottom cover or frame) and a second cover 1205 (e.g., a C-cover or top cover or frame). The first cover 1203 is not shown in FIGS. 12A and 12B for clarity. The example synthetic jet system 1200 includes a plurality of synthetic jets 602 (e.g., four jets) are placed in hyperbaric layout away from the processor 406 and/or a processor zone 1202 (e.g., a SOC zone). In contrast to the foregoing examples, the synthetic jets 602 of the illustrated example are not positioned on or coupled to a heat spreader 1204. The heat spreader 1204 of the illustrated example is positioned between the processor 406 and the first cover 1203 (e.g., vertically or in the z-direction in the illustrated example) and also between a first set 1206*a* of synthetic jets 602 and a second set 1206*b* of synthetic jets 602 (e.g., laterally, horizontally, or in the x-direction in the illustrated example). Specifically, the synthetic jets 602 are positioned on respective sides of the heat spreader 1204. The first set 1206*a* of synthetic jets 602 of the illustrated example is supported by a first frame 1207 and the second set 1206*b* of the synthetic jets 602 is supported by a second frame 1209. The first frame 1207 and the second frame 1209 are coupled to (directly or indirectly to) the second cover 1205. In some examples, the first frame 1207 and/or the second frame 1209 can be any structure of the electronic device 1201. Additionally, the synthetic jets 602 are oriented or stacked in the z-direction (e.g., a vertical direction). In other words, the synthetic jets 602 of the first set 1206*a* of synthetic jets 602 are in a stacked orientation such that a first one of the synthetic jets 602 of the first set 1206*a* is positioned above (or below) a second one of the synthetic jets 602 of the first set 1206*a*. Likewise, the synthetic jets 602 of the second set 1206*b* of synthetic jets 602 are in a stacked orientation such that a first one of the synthetic jets 602 of the second set 1206*b* is positioned above (or below) a second one of the synthetic jets 602 of the second set 1206*b*. Furthermore, the outlets 610 of the synthetic jets 602 are directed toward the processor 406. In operation, airflow 650 enters the inlets 608 of the respective synthetic jets 602 via inlet vents 1203*a* formed in the first cover 1203. Airflow 1226 exits the outlets 610 exits through an exhaust vent 1216 formed in a back wall 1214 of the electronic device 1201. In contrast to some of the examples noted above, the airflow does not impinge the heat spreader 1204 because the synthetic jets 602 are not positioned on the heat spreader 1204.

Figures 13A, 13B, 13C:
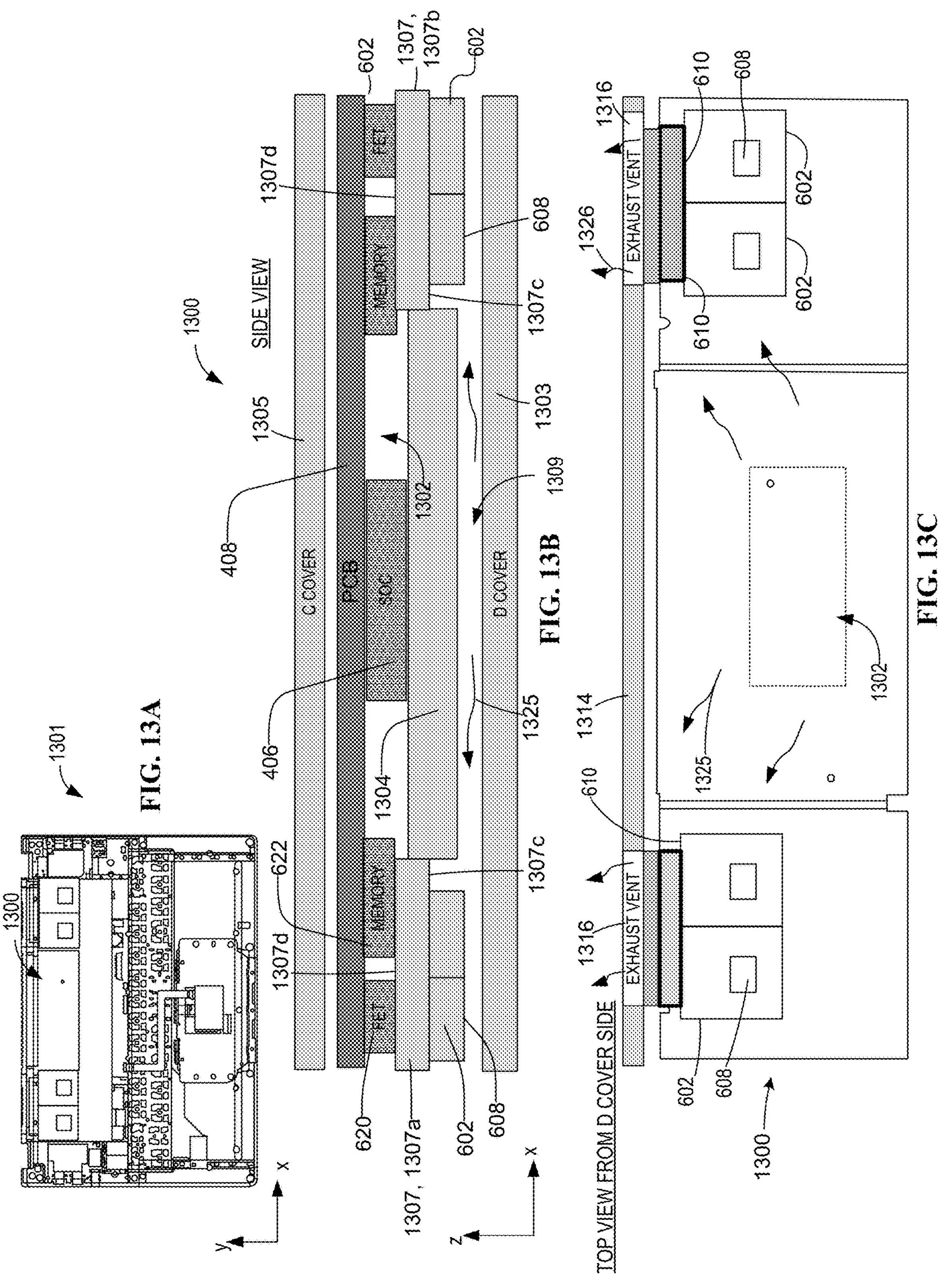
FIGS. 13A-13C illustrate other example synthetic jet system disclosed herein.

FIG. 13A is a bottom view of the example electronic device 1301 having the example synthetic jet system 1300 disclosed herein. FIG. 13B is a rear side view of the example synthetic jet system 1300. FIG. 13C is a bottom view of the example synthetic jet system 1300 of FIG. 13A. Referring to FIGS. 13A-13C, the electronic device 1301 includes the printed circuit board 408 and the processor 406 positioned between a first cover 1303 (e.g., a D-cover or bottom cover or frame) and a second cover 1305 (e.g., a C-cover or top cover or frame). A main heat spreader 1304 is coupled to the processor 406. The first cover 1303 is not shown in FIGS. 13A and 13C for clarity.

The example synthetic jet system 1300 includes a heat spreader 1307 (e.g., a Z-bend heat spreader) to support the plurality of synthetic jets 602 (e.g., four jets). For example, a first side 1307*a* (e.g., a first Z-bend) of the heat spreader 1307 supports a first plurality 1306*a* of the synthetic jets 602 and a second side1307*b* of the heat spreader 1307 supports a second plurality 1306*b* of the synthetic jets 602. In particular, the synthetic jets 602 (e.g., eight jets) of the illustrated example are positioned on a first surface 1307*c* (e.g., opposite a second surface 1307*d*) of the heat spreader 1307. The heat spreader 1307 of the illustrated example includes a main heat spreader portion 1304 positioned between the first side 1307*a* and the second side 1307*b* in a first direction (e.g., the x-direction) and positioned between the processor 406 and the first cover 1303 in a second direction (e.g., the z-direction). The synthetic jets 602 are placed in an evacuative layout away from a processor zone 1302 (e.g., a system on chip (SoC) zone) and/or the processor 406 such that the synthetic jets 602 are not positioned directly over or under the processor 406 but are positioned on lateral sides of the processor zone 1302 and/or the processor 406. Thus, the heat spreader 1307 is extended for non-SOC component cooling. In other words, the outlets 610 of the synthetic jets 602 are oriented in a direction away from the processor 406 (e.g., toward a back wall 1314 of the electronic device 1201). In other words, airflow 1325 (e.g., heated air) internally of the electronic device 701 (e.g., from the cavity 1309 and/or adjacent the processor 406) is drawn into the synthetic jets 602 and the exhaust 1326 exiting the outlets 610 is exhausted via exhaust vents 1316 formed in a back wall 1314 of the electronic device 1301. The outlets 610 of the example synthetic jets 602 of FIGS. 13A-13C are directed away from the processor 406. Thus, in the illustrated example, the outlets 610 are directed away from the processor 406 and/or the processor zone 1302 and can cool the non-system on chip components (e.g., FET 620, memory 622, etc.).

Figure 14A:
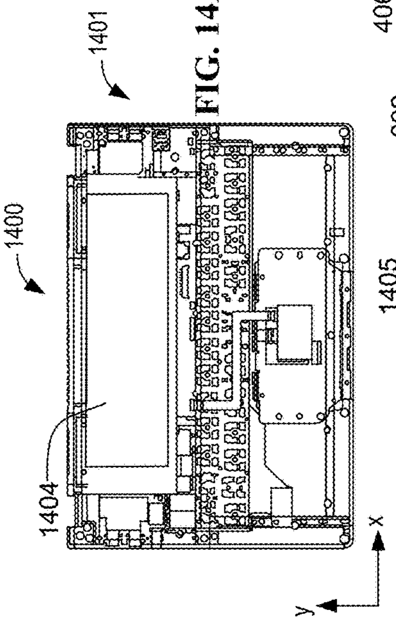
FIGS. 14A-14C illustrate other example synthetic jet systems disclosed herein.
Figure 14B:
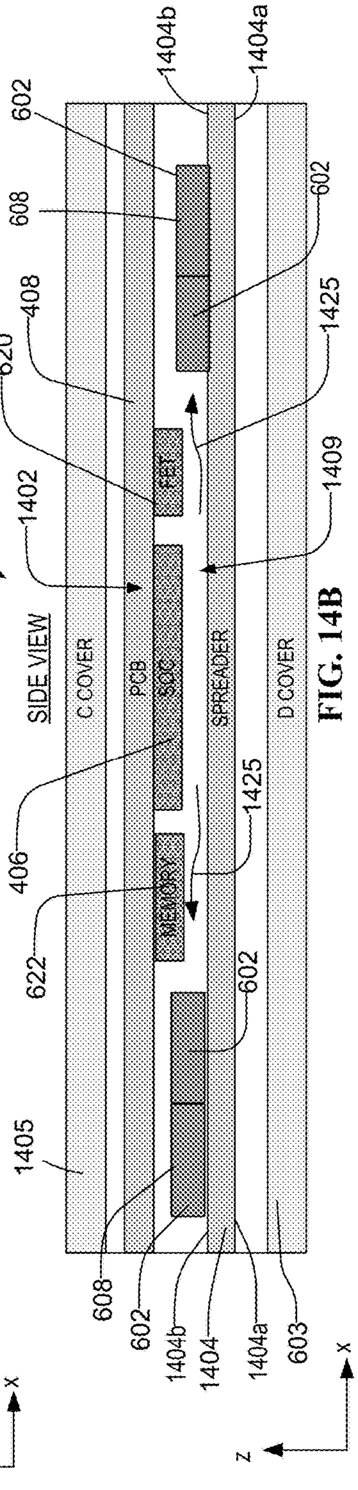
Figure 14C:
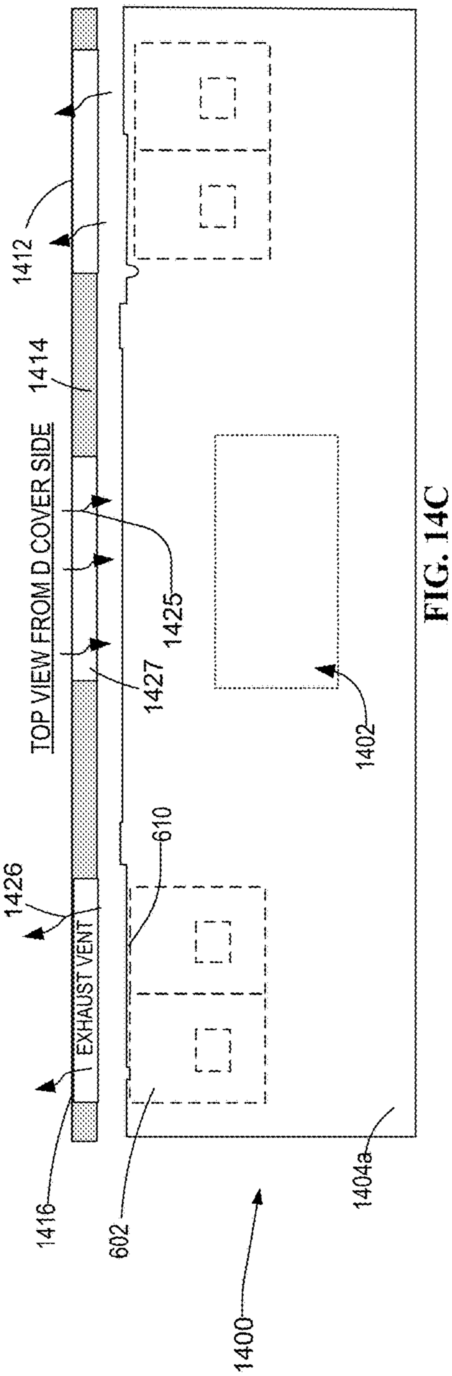

FIG. 14A is a bottom view of an example electronic device including another example synthetic jet system 1400 disclosed herein. FIG. 14B is a rear side view of the example synthetic jet system 1400. FIG. 14C is a Bottom view of the example synthetic jet system 1400. Referring to FIGS. 14B and 14C, the electronic device 1401 includes the printed circuit board 408 and the processor 406 positioned between a first cover 1403 (e.g., a D-cover or bottom cover or frame) and a second cover 1405 (e.g., a C-cover or top cover or frame). The first cover 1403 is not shown in FIGS. 14A and 14C for clarity. The example synthetic jet system 1400 includes a plurality of synthetic jets 602 (e.g., four jets) coupled to a second side 1404*b* of a heat spreader 1404 opposite a first side 1404*a*. The first side 1404*a* of the heat spreader 1404 is oriented toward the first cover 1403 and the second side 1404*b* is oriented toward the processor 406. Thus, the synthetic jets 602 and the processor 406 are positioned between the heat spreader 1404 and the circuit board 408. In operation, airflow 1425 is drawn from an inlet 1427 formed in a back wall 1414 of the electronic device 1401. The airflow 1425 flows within a cavity 1409 between the first cover 1403 and the second cover 1405 (e.g., from between the heat spreader 1404 and the circuit board 408). The airflow 1425 is drawn into the inlets 608 of the synthetic jets 602. In other words, cold or ambient temperature airflow 1425 (e.g., cold air) is drawn into the inlets 608 of the synthetic jets 602 via the inlet 1427 and the airflow 1426 exiting the outlets 610 is exhausted via exhaust vents 1416 formed in the back wall 1414 of the electronic device 1401. The outlets 610 of the example synthetic jets 602 of FIGS. 14A-14C are directed away from the processor 406 (e.g., toward the back wall 1414). In the illustrated example, the synthetic jets 602 provide cooling to the processor 406 and/or the processor region 1402 and non-system on chip components (e.g., FET 620, memory 622, etc.).

The foregoing examples of the synthetic jet systems can be cooling systems. Although each example synthetic jet systems disclosed above have certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features. Any one of the synthetic jet systems disclosed herein can implement the example thermal management system 150 and/or the electronic device 100 of FIG. 1A. For example, any one of the examples shown in FIGS. 6A-14C can be implemented with the bypass 430 shown in FIGS. 4A-4F. In some of these examples, some of the synthetic jets 602 of examples of FIGS. 6A-14C can be removed or eliminated. Additionally, although most of the examples disclosed herein includes four jets, any number of synthetic jets 402 and/or 602 can be used in a synthetic jet system. Additionally, the synthetic jets 402 and/or 602 can be positioned on a first side of a heat spreader, a second side of a heat spreader, a combination of a first side and a second side of a heat spreader, and/or on a support structure or frame of an electronic device located adjacent to the heat spreader. In some examples, a synthetic jet system can include a combination of one or more synthetic jets 402 of FIGS. 4A-4E and one or more synthetic jets 602 of FIGS. 6A-14C. In some examples, the synthetic jets 402 and/or 602 can include any number of jets. Anyone of the synthetic jet systems 400-1400 can implement the electronic device 100 of FIG. 1A and/or can be controlled by the example thermal management system 150 of FIG. 1A.

Figure 17:
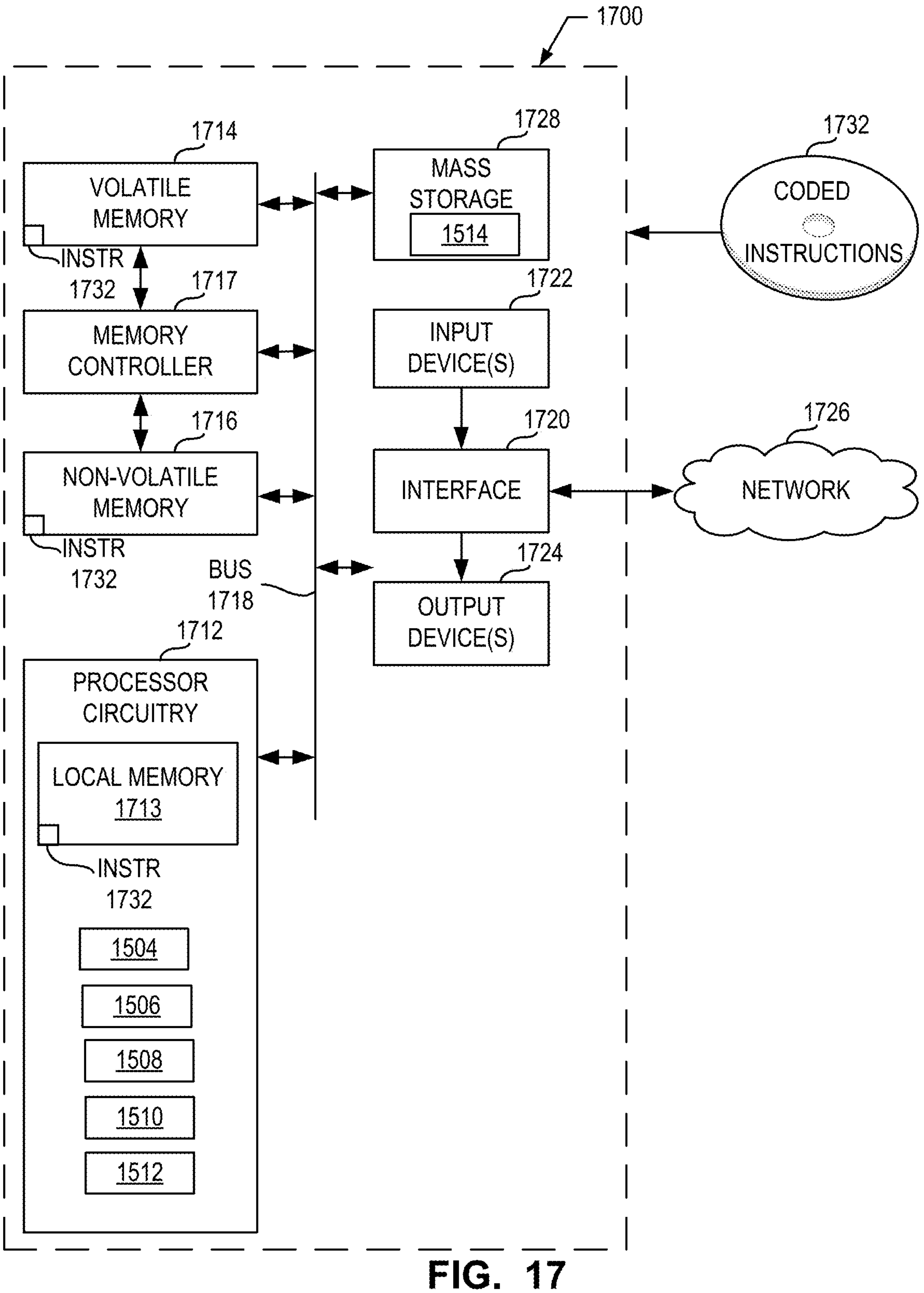
FIG. 17 is a block diagram of an example processing platform including processor circuitry structured to execute the example machine readable instructions and/or the example operations of FIG. 16 to implement the thermal management device of FIG. 15.

FIG. 17 is a block diagram of an example implementation of the example thermal management device 158 of the example thermal management system 150 of FIG. 1A in accordance with teachings of this disclosure to control an operation of the synthetic jets 402 of the synthetic jet system 156. In some examples, the thermal management device 158 can implement the example synthetic jet systems of FIGS. 6A-14C. The thermal management device 158 of FIG. 15 may be instantiated (e.g., creating an instance of, bring into being for any length of time, materialize, implement, etc.) by processor circuitry such as a central processing unit executing instructions. Additionally or alternatively, the thermal management device 158 of FIG. 15 of FIG. 2 may be instantiated (e.g., creating an instance of, bring into being for any length of time, materialize, implement, etc.) by an ASIC or an FPGA structured to perform operations corresponding to the instructions. It should be understood that some or all of the circuitry of FIG. 15 may, thus, be instantiated at the same or separate times. Some or all of the circuitry may be instantiated, for example, in one or more threads executing concurrently on hardware and/or in series on hardware. Moreover, in some examples, some or all of the circuitry of FIG. 15 may be implemented by one or more virtual machines and/or containers executing on the microprocessor.

The thermal management device 158 of the illustrated example includes an example I/O interface 1502, example temperature monitoring circuitry 1504, example device position determining circuitry 1506, example temperature threshold selection circuitry 1508, example comparator 1510 and example synthetic jet controller 1512, all of which are communicatively coupled (e.g., sharing data via memory) via a bus 1516, etc. A database 1514 stores a plurality of temperature thresholds or specifications for different or distinct positions of the electronic device 100.

The I/O interface 1502 provides or establishes communication between the temperature sensor(s) 152, the position sensor(s) 154 and/or other components of the electronic device 100 with the thermal management device 158. For example, the thermal management device 158 receives temperature signals 1518 from the temperature sensor(s) 152 and position signals 1520 from the position sensor(s) 154 via the I/O interface 1502. The I/O interface 1502 may be implemented by an API, for example.

The temperature monitoring circuitry 1504 receives one or more temperature signals 1518 from the temperature sensor(s) 152 via the I/O output interface 1502. The temperature monitoring circuitry 1504 converts the temperature signal(s) from the temperature sensor(s) 152 for comparison by the comparator 1510. For example, the temperature monitoring circuitry 1504 obtains or determines a measured temperature (e.g., a first temperature) of a hot spot skin or other area, a second measured temperature of electronic components (e.g., the processor 406), etc.

The device position determining circuitry 1506 receives one or more signals from the position sensor(s) 154 via the I/O output interface 1502. The device position determining circuitry 1506 determines an open position of the electronic device 100. For example, the position sensor(s) 154 can determine or measure an angle between the first housing 102 and the second housing 104. In some examples, based on the signal(s) 1520 from the position sensor(s) 154, the device position determining circuitry 1506 determines if the electronic device 100 is in the laptop mode 122, the tablet mode 124, the kiosk mode 126, or the tent mode 128. In some examples, the position sensor(s) 154 (e.g., via gyroscope, accelerometer, and/or other sensor) can detect whether the laptop is on a body of a person (e.g., a lap, an arm, a hand, etc.). The device position determining circuitry 1506 communicates the device position to the temperature threshold selection circuitry 1508.

The temperature threshold selection circuitry 1508 obtains from the database 1514 a temperature threshold associated with the determined position of the electronic device provided by the device positioning determining circuitry 1506. For example, the electronic device 100 and/or the thermal management system 150 can employ different temperature threshold specifications based on a position of the electronic device 100. For example, a first temperature threshold can be associated with a hot spot region corresponding to the electronic device 100 being in the laptop mode 122 or the tablet mode 124. For example, a second temperature threshold can be associated with the hot spot region corresponding to the electronic device 100 being in the kiosk mode 126 or the tent mode 128. Based on the device position, the temperature threshold selection circuitry 1508 obtains a temperature threshold from the database 1514 (e.g., via a look-up table) that is associated with the device position and provides the selected temperature value to the comparator 1510.

The comparator 1510 compares the measured temperature and the selected temperature threshold. The jet device controller 1512 activates the synthetic jet system 156 (e.g., one or more synthetic jets 402) when the measured temperature exceeds the selected temperature threshold. The jet device controller 1512 deactivates the synthetic jet system 156 (e.g., one or more synthetic jets 402) when the measured temperature does not exceed the selected temperature threshold.

In some examples, the thermal management device 158 and/or the jet device controller 1512 can activate select ones of the synthetic jets 402 of a synthetic jet system 156. For example, the jet device controller 1512 can activate select ones of the synthetic jets 402 of a synthetic jet system 156 when monitoring multiple hot spot areas or zones. In some examples, the jet device controller 1512 activates two or more of the synthetic jets 402 of a synthetic jet system 156 in a pattern (e.g., activate the first set 402*a* of synthetic jets 402 for a first duration, activate the second set 402*b* of synthetic jets 402 for a second duration, offset activations of the first set 402*a* and the second set 402*b* of synthetic jets 402, etc.

Figure 15:
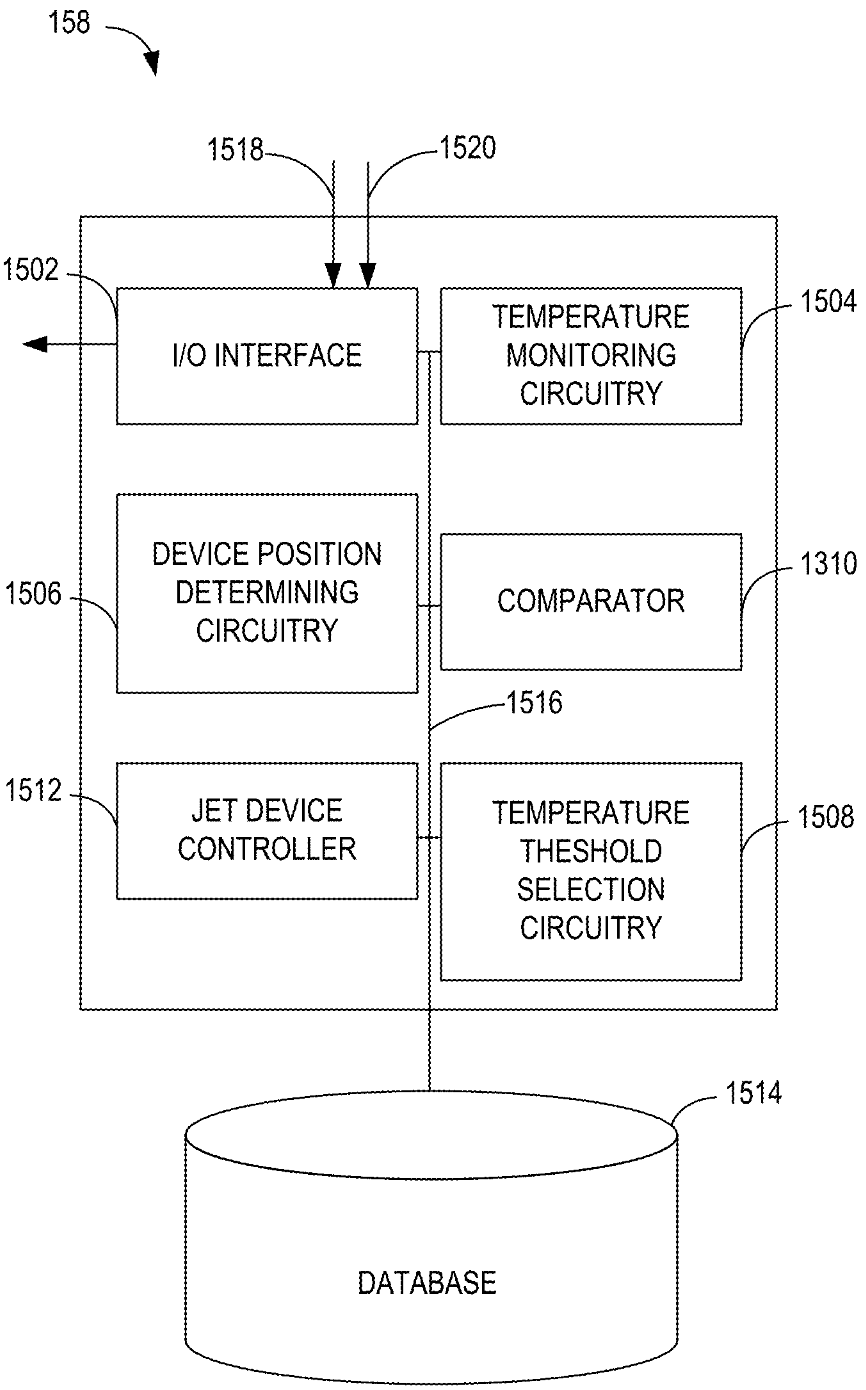
FIG. 15 is a block diagram of an example implementation of a thermal management device of an example thermal management system of the example electronic device of FIG. 1A constructed in accordance with teachings of this disclosure.

While an example manner of implementing the thermal management device 158 of FIG. 1A is illustrated in FIG. 15, one or more of the elements, processes, and/or devices illustrated in FIG. 15 may be combined, divided, re-arranged, omitted, eliminated, and/or implemented in any other way. Further, the example I/O interface 1502, the example temperature monitor circuitry 1504, the example device position determiner circuitry 1506, the example temperature threshold selection circuitry 1508, the example comparator 1510 and the example synthetic jet controller 1512 and/or, more generally, the example thermal management device 158 of FIG. 15, may be implemented by hardware alone or by hardware in combination with software and/or firmware. Thus, for example, any of the example I/O interface 1502, the example temperature monitor circuitry 1504, the example device position determiner circuitry 1506, the example temperature threshold selection circuitry 1508, the example comparator 1510 and the example synthetic jet controller 1512 and/or, more generally, the example thermal management device 158, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device (s) (FPLD(s)) such as Field Programmable Gate Arrays (FPGAs). Further still, the example thermal management device 158 of FIG. 1A may include one or more elements, processes, and/or devices in addition to, or instead of, those illustrated in FIG. 15, and/or may include more than one of any or all of the illustrated elements, processes and devices.

In some examples, the thermal management device 158 includes means for receiving, retrieving and/or otherwise obtaining temperature signals (e.g., output signals) from the temperature sensor(s) 152. For example, the means for receiving, retrieving and/or otherwise obtaining temperature signals (e.g., output signals) from the temperature sensor(s) 152 may be implemented by the temperature monitoring circuitry 1504. In some examples, the temperature monitoring circuitry 1504may be instantiated by processor circuitry such as the example processor circuitry 1712 of FIG. 17. For instance, the temperature monitoring circuitry 1504 may be instantiated by the example general purpose processor circuitry 1800 of FIG. 18 executing machine executable instructions such as that implemented by at least blocks 1602, 1604 of FIG. 16.

In some examples, the thermal management device 158 includes means for receiving, retrieving and/or otherwise obtaining position signals (e.g., output signals) from the position sensor(s) 154. For example, the means for receiving, retrieving and/or otherwise obtaining position signals (e.g., output signals) from the temperature sensor(s) 152 may be implemented by the device position determining circuitry 1506. In some examples, the device position determining circuitry 1506 may be instantiated by processor circuitry such as the example processor circuitry 1712 of FIG. 17. For instance, the device position determining circuitry 1506 may be instantiated by the example general purpose processor circuitry 1800 of FIG. 18 executing machine executable instructions such as that implemented by at least block 1612 of FIG. 16.

In some examples, the thermal management device 158 includes means for controlling one or more synthetic jets 402 of the synthetic jet system 156. For example, means for controlling one or more synthetic jets 402 of the synthetic jet system 156 may be implemented by the jet device controller 1512. In some examples, the jet device controller 1512 may be instantiated by processor circuitry such as the example processor circuitry 1712 of FIG. 17. For instance, the jet device controller 1512 may be instantiated by the example general purpose processor circuitry 1800 of FIG. 18 executing machine executable instructions such as that implemented by at least blocks 1606, 1608, 1610, 1614, 1616, 1618, 1620, 1622, 1604 of FIG. 16.

In some examples, the thermal management device 158 includes means for selecting and/or otherwise obtaining a threshold temperature associated with a detected position of the electronic device. For example, the means for selecting and/or otherwise obtaining a threshold temperature associated with a detected position of the electronic device may be implemented by the temperature threshold selection circuitry 1508. In some examples, the temperature threshold selection circuitry 1508 may be instantiated by processor circuitry such as the example processor circuitry 1712 of FIG. 17. For instance, the temperature threshold selection circuitry 1508 may be instantiated by the example general purpose processor circuitry 1800 of FIG. 18 executing machine executable instructions such as that implemented by at least block 1602 of FIG. 16.

In some examples, the thermal management device 158 includes means for comparing a threshold temperature and a measured temperature. For example, the means for comparing a threshold temperature and a measured temperature may be implemented by the comparator 1510. In some examples, the comparator 1510 may be instantiated by processor circuitry such as the example processor circuitry 1712 of FIG. 17. For instance, the comparator 1510 may be instantiated by the example general purpose processor circuitry 1800 of FIG. 18 executing machine executable instructions such as that implemented by at least block 1602 of FIG. 16.

Figure 19:
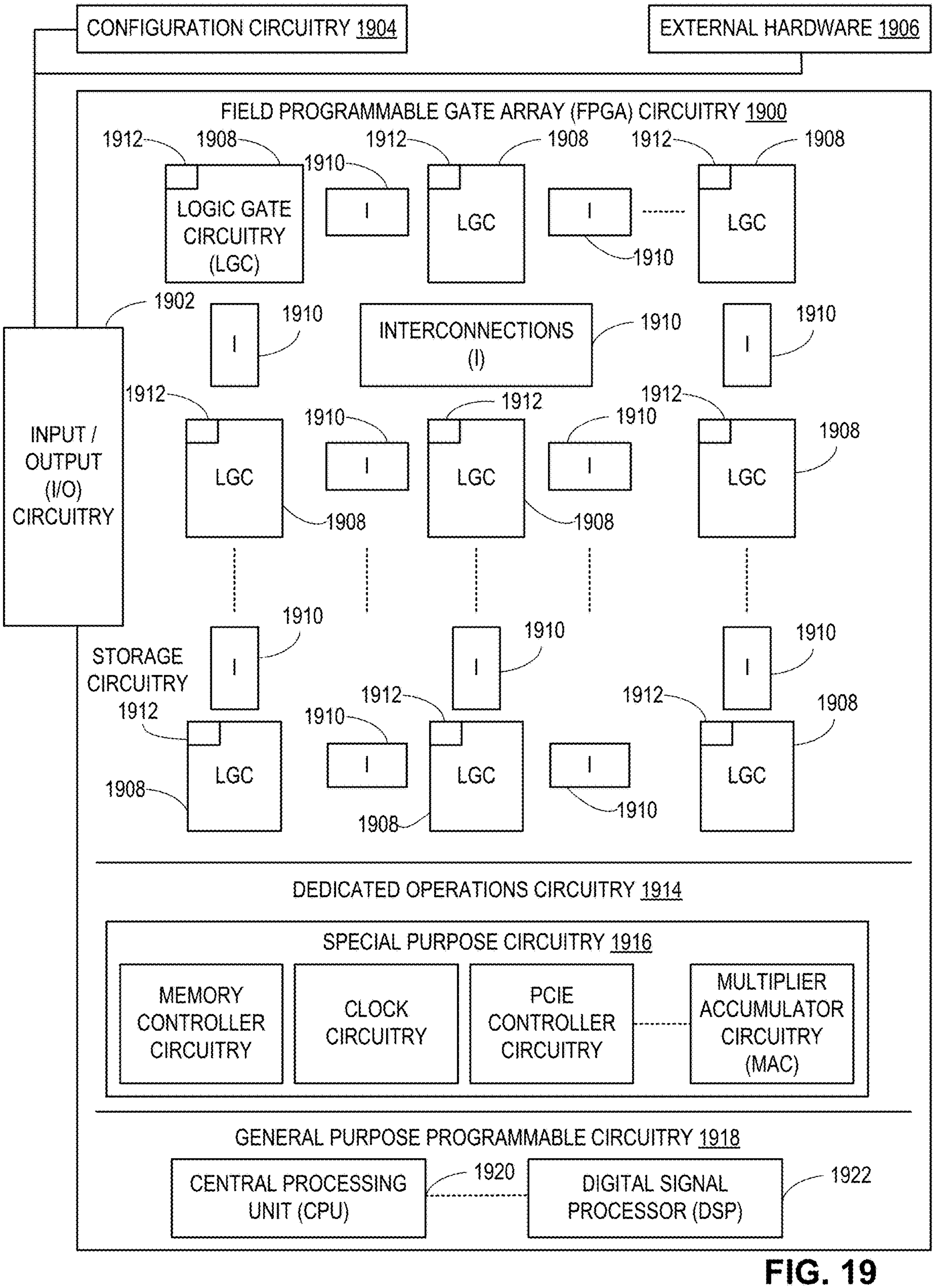
FIG. 19 is a block diagram of another example implementation of the processor circuitry of FIG. 17.

In some examples, the temperature monitoring circuitry 1504, the device position determining circuitry 1506, the comparator 1510, the jet device controller 1512 and/or the temperature threshold selection circuitry 1508 may be instantiated by hardware logic circuitry, which may be implemented by an ASIC or the FPGA circuitry 1900 of FIG. 19 structured to perform operations corresponding to the machine readable instructions. Additionally or alternatively, the temperature monitoring circuitry 1504, the device position determining circuitry 1506, the comparator 1510, the jet device controller 1512 and/or the temperature threshold selection circuitry 1508 may be instantiated by any other combination of hardware, software, and/or firmware. For example, the temperature monitoring circuitry 1504, the device position determining circuitry 1506, the comparator 1510, the jet device controller 1512 and/or the temperature threshold selection circuitry 1508 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

Figure 16:
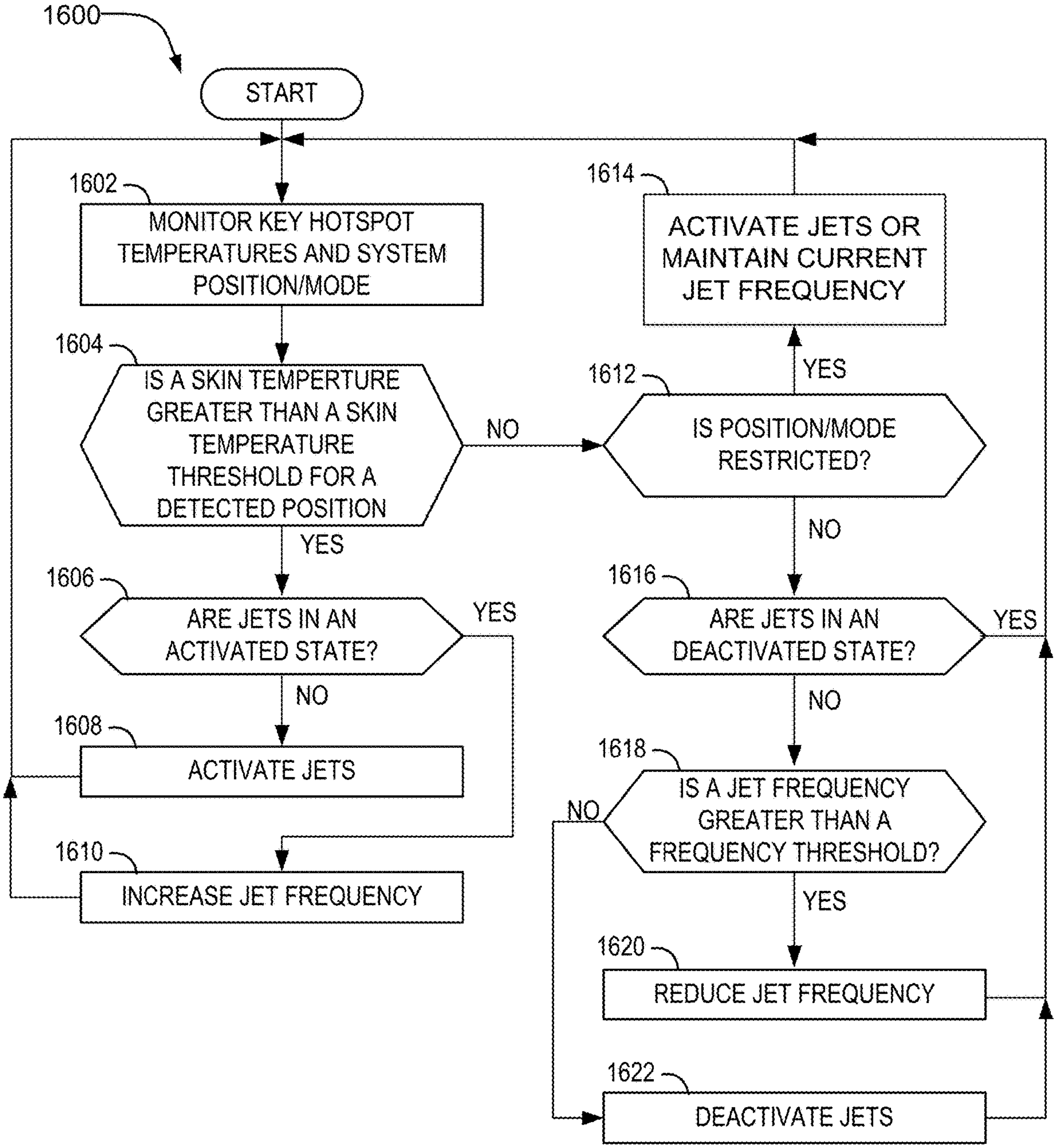
FIG. 16 is a flowchart representative of example machine readable instructions and/or example operations that may be executed by example processor circuitry to implement the example thermal management device of FIG. 15.

A flowchart representative of example hardware logic circuitry, machine readable instructions, hardware implemented state machines, and/or any combination thereof for implementing the thermal management device 158 of FIG. 15 is shown in FIG. 16. The machine readable instructions may be one or more executable programs or portion(s) of an executable program for execution by processor circuitry, such as the processor circuitry 1712 shown in the example processor platform 1700 discussed below in connection with FIG. 17 and/or the example processor circuitry discussed below in connection with FIGS. 18 and/or 19. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowchart illustrated in FIG. 17, many other methods of implementing the example thermal management device 158 may alternatively be used. For example, the order of execution of the blocks may be changed, and/or some of the blocks described may be changed, eliminated, or combined. Additionally, or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIG. 16. may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 16 is a flowchart representative of example machine readable instructions and/or example operations 1600 that may be executed and/or instantiated by processor circuitry to enable thermal control scheme and/or to implement the thermal management device described above. The machine readable instructions and/or operations 1600 of FIG. 16 begin at block 1602, at which the temperature monitoring circuitry 1504 monitors key hotspot temperatures (e.g., measured temperatures) and the device position determining circuitry 1506 determines a position of the electronic device 100.

At block 1604, the comparator 1510 compares the measured temperature and a selected temperature threshold associated with the detected position. To determine the temperature threshold, for example, the temperature threshold selection circuitry 1508 obtains, receives and/or otherwise retrieves the measured temperature provided by the temperature monitoring circuitry 1504 and the determined position of the electronic device 100 provided by the device position determining circuitry 1506. The temperature threshold selection circuitry 1508 selects a temperature threshold from the database 1514 associated or corresponding with the determined device position and/or the measured temperature.

If at block 1604 the measured temperature (e.g., skin temperature) exceeds the selected threshold temperature (e.g., the current spec), the jet device controller 1512 determines if the one or more synthetic jets 402 are in an activated state (block 1606). If the jet device controller 1512 determines that the jets are not in an activate state at block 1606, the jet device controller 1512 activates the one or more synthetic jets 402 of the synthetic jet system 156 to increase an airflow through the electronic device 100 (block 1608). If the jet device controller 1512 determines that the synthetic jets 402 are in an activated state at block 1604, the jet device controller 1512 increases a frequency of the one or more synthetic jets 402 to increase an airflow through the electronic device 100 (block 1610).

If at block 1604 the measured temperature (e.g., skin temperature) does not exceed the selected threshold temperature (e.g., the current spec), the device position determining circuitry 1506 determines whether the position of the electronic device 100 is in a restricted position (e.g., a user touch position, laptop mode 122, tablet mode 124, a stricter position/mode)(block 1612).

If at block 1612 the device position determining circuitry 1506 determines that the position of the electronic device 100 is in a restricted position (e.g., a user touch position, laptop mode 122, tablet mode 124, a stricter position/mode), the jet device controller 1512 activates the synthetic jet system 156 and/or maintains a frequency of one or more synthetic jets 402 of the synthetic jet system 156 to increase airflow through the electronic device 100 (block 1614).

If at block 1612 the device position determining circuitry 1506 determines that the position of the electronic device 100 is not in a restricted position (e.g., a non-user touch position, a tent mode 128, a kiosk mode 126, a relaxed position), the jet device controller 1512 determines if the synthetic jets 402 are in a deactivated state (block 1616).

If at block 1616 the jet device controller 1512 determines that the jets are in a deactivated state, control returns to block 1602.

If at block 1616 the jet device controller 1512 determines that the jets are not a deactivated state, the jet device controller 1512 determines if a jet frequency is greater than frequency threshold (block 1618).

If at block 1618 the jet device controller 1512 determines that the jet frequency is greater than frequency threshold, the jet device controller 1512 reduces the jet frequency and control returns to block 1602.

If at block 1618 the jet device controller 1512 determines that the jet frequency is not greater than frequency threshold, the jet device controller 1512 deactivates the one or more synthetic jets 402 of the synthetic jet system 156 and control returns to block 1602.

FIG. 17 is a block diagram of an example processor platform 1700 structured to execute and/or instantiate the machine readable instructions and/or the operations of FIG. 16 to implement the thermal management device 158 of FIG. 15. The processor platform 1700 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a headset (e.g., an augmented reality (AR) headset, a virtual reality (VR) headset, etc.) or other wearable device, or any other type of computing device.

The processor platform 1700 of the illustrated example includes processor circuitry 1712. The processor circuitry 1712 of the illustrated example is hardware. For example, the processor circuitry 1712 can be implemented by one or more integrated circuits, logic circuits, FPGAs microprocessors, CPUs, GPUs, DSPs, and/or microcontrollers from any desired family or manufacturer. The processor circuitry 1712 may be implemented by one or more semiconductor based (e.g., silicon based) devices. In this example, the processor circuitry 1712 implements the example temperature monitoring circuitry 1504, the example device position determining circuitry 1506, the example temperature threshold selection circuitry 1508, the example comparator 1510 and the example synthetic jet controller 1512.

The processor circuitry 1712 of the illustrated example includes a local memory 1713 (e.g., a cache, registers, etc.). The processor circuitry 1712 of the illustrated example is in communication with a main memory including a volatile memory 1714 and a non-volatile memory 1716 by a bus 1718. The volatile memory 1714 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1716 may be implemented by flash memory and/or any other desired type of memory device. Access to the main memory 1714, 1716 of the illustrated example is controlled by a memory controller 1717.

The processor platform 1700 of the illustrated example also includes interface circuitry 1720. The interface circuitry 1720 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1722 are connected to the interface circuitry 1720. The input device(s) 1722 permit(s) a user to enter data and/or commands into the processor circuitry 1712. The input device(s) 1722 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1724 are also connected to the interface circuitry 1720 of the illustrated example. The output device(s) 1724 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), and/or a tactile output device. The interface circuitry 1720 of the illustrated example, thus, typically includes a graphics driver card, a graphics driver chip, and/or graphics processor circuitry such as a GPU.

The interface circuitry 1720 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1726. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1700 of the illustrated example also includes one or more mass storage devices 1728 to store software and/or data. Examples of such mass storage devices 1728 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine executable instructions 1732, which may be implemented by the machine readable instructions of FIG. 15, may be stored in the mass storage device 1728, in the volatile memory 1714, in the non-volatile memory 1716, and/or on a removable non-transitory computer readable storage medium such as a CD or DVD.

Figure 18:
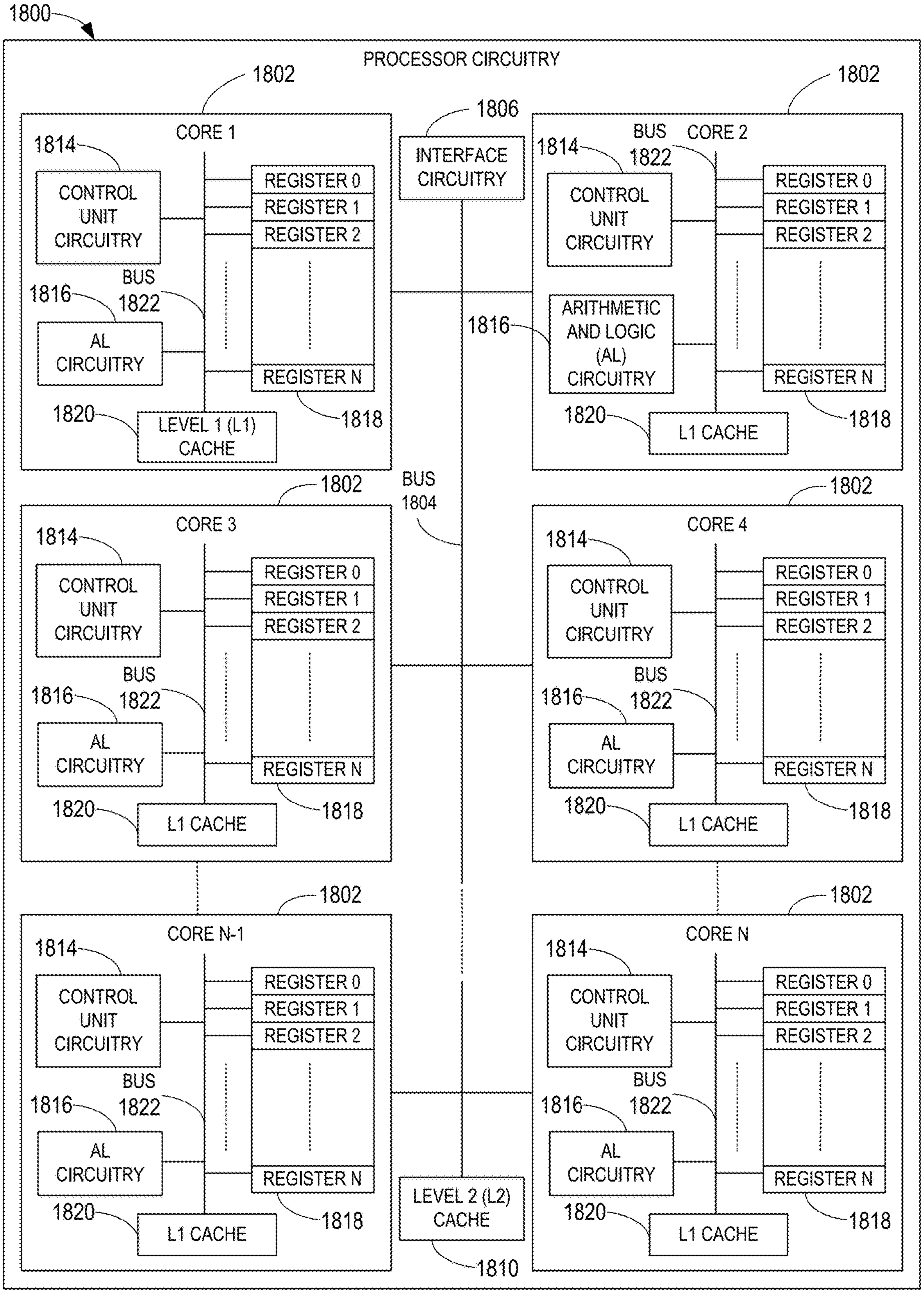
FIG. 18 is a block diagram of an example implementation of the processor circuitry of FIG. 17.

FIG. 18 is a block diagram of an example implementation of the processor circuitry 1712 of FIG. 17. In this example, the processor circuitry 1712 of FIG. 17 is implemented by a general purpose microprocessor 1800. The general purpose microprocessor circuitry 1800 executes some or all of the machine readable instructions of the flowchart of FIG. 16 to effectively instantiate the circuitry of FIG. 15 as logic circuits to perform the operations corresponding to those machine readable instructions. In some such examples, the circuitry of FIG. 15 is instantiated by the hardware circuits of the microprocessor 1800 in combination with the instructions. For example, the microprocessor 1800 may implement multi-core hardware circuitry such as a CPU, a DSP, a GPU, an XPU, etc. Although it may include any number of example cores 1802 (e.g., 1 core), the microprocessor 1800 of this example is a multi-core semiconductor device including N cores. The cores 1802 of the microprocessor 1800 may operate independently or may cooperate to execute machine readable instructions. For example, machine code corresponding to a firmware program, an embedded software program, or a software program may be executed by one of the cores 1802 or may be executed by multiple ones of the cores 1802 at the same or separate times. In some examples, the machine code corresponding to the firmware program, the embedded software program, or the software program is split into threads and executed in parallel by two or more of the cores 1802. The software program may correspond to a portion or all of the machine readable instructions and/or operations represented by the flowchart of FIG. 15.

The cores 1802 may communicate by a first example bus 1804. In some examples, the first bus 1804 may implement a communication bus to effectuate communication associated with one(s) of the cores 1802. For example, the first bus 1804 may implement at least one of an Inter-Integrated Circuit (I2C) bus, a Serial Peripheral Interface (SPI) bus, a PCI bus, or a PCIe bus. Additionally, or alternatively, the first bus 1804 may implement any other type of computing or electrical bus. The cores 1802 may obtain data, instructions, and/or signals from one or more external devices by example interface circuitry 1806. The cores 1802 may output data, instructions, and/or signals to the one or more external devices by the interface circuitry 1806. Although the cores 1802 of this example include example local memory 1820 (e.g., Level 1 (L1) cache that may be split into an L1 data cache and an L1 instruction cache), the microprocessor 1800 also includes example shared memory 1810 that may be shared by the cores (e.g., Level 2 (L2_cache)) for high-speed access to data and/or instructions. Data and/or instructions may be transferred (e.g., shared) by writing to and/or reading from the shared memory 1810. The local memory 1820 of each of the cores 1802 and the shared memory 1810 may be part of a hierarchy of storage devices including multiple levels of cache memory and the main memory (e.g., the main memory 1714, 1716 of FIG. 17). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1802 may be referred to as a CPU, DSP, GPU, etc., or any other type of hardware circuitry. Each core 1802 includes control unit circuitry 1814, arithmetic and logic (AL) circuitry (sometimes referred to as an ALU) 1816, a plurality of registers 1818, the L1 cache 1820, and an example second bus 1822. Other structures may be present. For example, each core 1802 may include vector unit circuitry, single instruction multiple data (SIMD) unit circuitry, load/store unit (LSU) circuitry, branch/jump unit circuitry, floating-point unit (FPU) circuitry, etc. The control unit circuitry 1814 includes semiconductor-based circuits structured to control (e.g., coordinate) data movement within the corresponding core 1802. The AL circuitry 1816 includes semiconductor-based circuits structured to perform one or more mathematic and/or logic operations on the data within the corresponding core 1802. The AL circuitry 1816 of some examples performs integer based operations. In other examples, the AL circuitry 1816 also performs floating point operations. In yet other examples, the AL circuitry 1816 may include first AL circuitry that performs integer based operations and second AL circuitry that performs floating point operations. In some examples, the AL circuitry 1816 may be referred to as an Arithmetic Logic Unit (ALU). The registers 1818 are semiconductor-based structures to store data and/or instructions such as results of one or more of the operations performed by the AL circuitry 1816 of the corresponding core 1802. For example, the registers 1818 may include vector register(s), SIMD register(s), general purpose register(s), flag register(s), segment register(s), machine specific register(s), instruction pointer register(s), control register(s), debug register(s), memory management register(s), machine check register(s), etc. The registers 1818 may be arranged in a bank as shown in FIG. 18. Alternatively, the registers 1818 may be organized in any other arrangement, format, or structure including distributed throughout the core 1802 to shorten access time. The second bus 1822 may implement at least one of an I2C bus, a SPI bus, a PCI bus, or a PCIe bus Each core 1802 and/or, more generally, the microprocessor 1800 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1800 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

FIG. 19 is a block diagram of another example implementation of the processor circuitry 1712 of FIG. 17. In this example, the processor circuitry 1712 is implemented by FPGA circuitry 1900. The FPGA circuitry 1900 can be used, for example, to perform operations that could otherwise be performed by the example microprocessor 1800 of FIG. 18 executing corresponding machine readable instructions. However, once configured, the FPGA circuitry 1900 instantiates the machine readable instructions in hardware and, thus, can often execute the operations faster than they could be performed by a general purpose microprocessor executing the corresponding software.

More specifically, in contrast to the microprocessor 1800 of FIG. 18 described above (which is a general purpose device that may be programmed to execute some or all of the machine readable instructions represented by the flowchart of FIG. 15 but whose interconnections and logic circuitry are fixed once fabricated), the FPGA circuitry 1900 of the example of FIG. 6 includes interconnections and logic circuitry that may be configured and/or interconnected in different ways after fabrication to instantiate, for example, some or all of the machine readable instructions represented by the flowchart of FIG. 3. In particular, the FPGA 1900 may be thought of as an array of logic gates, interconnections, and switches. The switches can be programmed to change how the logic gates are interconnected by the interconnections, effectively forming one or more dedicated logic circuits (unless and until the FPGA circuitry 1900 is reprogrammed). The configured logic circuits enable the logic gates to cooperate in different ways to perform different operations on data received by input circuitry. Those operations may correspond to some or all of the software represented by the flowchart of FIG. 15. As such, the FPGA circuitry1900 may be structured to effectively instantiate some or all of the machine readable instructions of the flowchart of FIG. 15 as dedicated logic circuits to perform the operations corresponding to those software instructions in a dedicated manner analogous to an ASIC. Therefore, the FPGA circuitry 1900 may perform the operations corresponding to the some or all of the machine readable instructions of FIG. 19 faster than the general purpose microprocessor can execute the same.

In the example of FIG. 19, the FPGA circuitry 1900 is structured to be programmed (and/or reprogrammed one or more times) by an end user by a hardware description language (HDL) such as Verilog. The FPGA circuitry 1900 of FIG. 19, includes example input/output (I/O) circuitry 1902 to obtain and/or output data to/from example configuration circuitry 1904 and/or external hardware (e.g., external hardware circuitry) 1906. For example, the configuration circuitry 1904 may implement interface circuitry that may obtain machine readable instructions to configure the FPGA circuitry 1900, or portion(s) thereof. In some such examples, the configuration circuitry 1904 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1906 may implement the microprocessor 1800 of FIG. 18. The FPGA circuitry 1900 also includes an array of example logic gate circuitry 1908, a plurality of example configurable interconnections 1910, and example storage circuitry 1912. The logic gate circuitry 1908 and interconnections 1910 are configurable to instantiate one or more operations that may correspond to at least some of the machine readable instructions of FIG. 15 and/or other desired operations. The logic gate circuitry 1908 shown in FIG. 19 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1908 to enable configuration of the electrical structures and/or the logic gates to form circuits to perform desired operations. The logic gate circuitry 1908 may include other electrical structures such as look-up tables (LUTs), registers (e.g., flip-flops or latches), multiplexers, etc.

The interconnections 1910 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1908 to program desired logic circuits.

The storage circuitry 1912 of the illustrated example is structured to store result(s) of the one or more of the operations performed by corresponding logic gates. The storage circuitry 1912 may be implemented by registers or the like. In the illustrated example, the storage circuitry 1912 is distributed amongst the logic gate circuitry 1908 to facilitate access and increase execution speed.

The example FPGA circuitry 1900 of FIG. 19 also includes example Dedicated Operations Circuitry 1914. In this example, the Dedicated Operations Circuitry 1914 includes special purpose circuitry 1916 that may be invoked to implement commonly used functions to avoid the need to program those functions in the field. Examples of such special purpose circuitry 1916 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1900 may also include example general purpose programmable circuitry 1918 such as an example CPU 1920 and/or an example DSP 1922. Other general purpose programmable circuitry 1918 may additionally or alternatively be present such as a GPU, an XPU, etc., that can be programmed to perform other operations.

Although FIGS. 18 and 19 illustrate two example implementations of the processor circuitry 1712 of FIG. 17, many other approaches are contemplated. For example, as mentioned above, modern FPGA circuitry may include an on-board CPU, such as one or more of the example CPU 1920 of FIG. 19. Therefore, the processor circuitry 1712 of FIG. 17 may additionally be implemented by combining the example microprocessor 1800 of FIG. 18 and the example FPGA circuitry 1900 of FIG. 19. In some such hybrid examples, a first portion of the machine readable instructions represented by the flowchart of FIG. 15 may be executed by one or more of the cores 1802 of FIG. 18 and a second portion of the machine readable instructions represented by the flowchart of FIG. 15 may be executed by the FPGA circuitry 1900 of FIG. 19, and/or a third portion of the machine readable instructions represented by the flowchart of FIG. 16 may be executed by an A SIC. It should be understood that some or all of the circuitry of FIG. 15 may, thus, be instantiated at the same or different times. Some or all of the circuitry may be instantiated, for example, in one or more threads executing concurrently and/or in series. Moreover, in some examples, some or all of the circuitry of FIG. 15 may be implemented within one or more virtual machines and/or containers executing on the microprocessor.

In some examples, the processor circuitry 1712 of FIG. 17 may be in one or more packages. For example, the processor circuitry 1800 of FIG. 18 and/or the FPGA circuitry 1900 of FIG. 19 may be in one or more packages. In some examples, an XPU may be implemented by the processor circuitry 1712 of FIG. 17, which may be in one or more packages. For example, the XPU may include a CPU in one package, a DSP in another package, a GPU in yet another package, and an FPGA in still yet another package.

Example methods, apparatus, systems, and articles of manufacture to analyze computer system attack mechanisms are disclosed herein. Further examples and combinations thereof include the following:

Example 1 includes an electronic device having a heat spreader including a first surface and a second surface opposite the first surface. A synthetic jet is coupled to the first surface of the heat spreader. The synthetic jet and the heat spreader define a fluid flow passageway having an inlet, a first outlet and a second outlet. The synthetic jet and the heat spreader to bifurcate airflow from the inlet such that the first outlet is to exhaust airflow from the passageway adjacent the first surface of the heat spreader and the second outlet is to exhaust airflow from the passageway adjacent the second surface of the heat spreader.

Example 2 includes the electronic device of example 1, where the heat spreader and the synthetic jet define a bypass to bifurcate the airflow.

Example 3 includes the electronic component of any one of the examples 1 and 2, where the bypass is formed via a first opening in the heat spreader between the first surface and the second surface and a second opening in a body of the synthetic jet, the first opening aligned with the second opening.

Example 4 includes the electronic component of any one of the examples 1-3, where the first outlet is defined by third opening in the body of the synthetic jet, and the second outlet is formed by the first opening and the second opening.

Example 5 includes the electronic component of any one of the examples 1-4, where the third opening is in a first wall of the body and the second opening is in a second wall of the body, the first wall is non-parallel relative to the second wall.

Example 6 includes the electronic component of any one of the examples 1-5, further including a gasket between the synthetic jet and the first surface of the heat spreader, the gasket includes a slot to fluidly couple the first opening and the second opening.

Example 7 includes the electronic component of any one of the examples 1-6, further including a heat exchanger downstream from the second outlet.

Example 8 includes the electronic component of any one of the examples 1-7, further including a duct to channel fluid flow from the first opening and the second opening toward the heat exchanger.

Example 9 includes the electronic component of any one of the examples 1-8, where the second surface of the heat spreader is oriented toward processor circuitry.

Example 10 includes the electronic component of any one of the examples 1-9, where at least one of the first outlet or the second outlet is oriented in a direction away from the processor circuitry.

Example 11 includes the electronic component of any one of the examples 1-10, where at least one of the first outlet or the second outlet is oriented in a direction towards the processor circuitry.

Example 12 includes the electronic component of any one of the examples 1-11, where the synthetic jet is spaced laterally relative to the processor circuitry such that the synthetic jet is positioned outside a perimeter of the processor circuitry.

Example 13 includes the electronic component of any one of the examples 1-12, where the synthetic jet is not positioned over the processor circuitry.

Example 14 includes a synthetic jet including a body having a plurality of walls to define to define a fluid flow passageway, a first wall of the plurality of walls having a first opening to define an inlet of the fluid flow passageway, a second wall of the plurality of walls having a second opening to define a first outlet of the fluid flow passageway, a third wall of the plurality of walls having a third opening to define a second outlet of the fluid flow passageway, and an actuator positioned in the fluid flow passageway to generate a fluid flow from the inlet and to the first outlet and the second outlet.

Example 15 includes the electronic device of example 14, where the body is coupled to a heat spreader, the heat spreader including a fourth opening aligned with the third opening.

Example 16 includes the electronic device of any one of examples 14-15, where the second wall is perpendicular relative to the first wall and the third wall.

Example 17 includes the electronic device of any one of examples 14-16, where the first outlet is formed via a first aperture in a first wall of the body, and wherein the second outlet is formed via a second aperture in a second wall of the body.

Example 18 includes the electronic device of any one of examples 14-17, further including a gasket coupled to an outer surface of the third wall, the gasket having a slot aligned with the third opening.

Example 19 includes an electronic device having a processor circuitry, a heat spreader to dissipate heat from the processor circuitry, and a plurality of synthetic jets coupled to the heat spreader, the plurality of synthetic jets defining outlets.

Example 20 includes the electronic device of example 19, where the outlets of the synthetic jets are oriented in a direction away from the processor circuitry.

Example 21 includes the electronic device of any one of examples 19 or 20, where the outlets of the synthetic jets are oriented in a direction toward the processor circuitry.

Example 22 includes the electronic device of any one of examples 19-21, where the plurality of jets includes a first set of jets having first outlets oriented in a direction toward the processor circuitry and a second set of jets having second outlets oriented in a direction away from the processor circuitry.

Example 23 includes a method including positioning a heat spreader over processor circuitry of an electronic device to dissipate heat generated from the processor circuitry of an electronic device and positioning synthetic jets laterally relative to the processor circuitry such that the synthetic jets are not positioned over the processor circuitry.

Example 24 includes the method of example 23, further including orienting outlets of the synthetic jets in a direction away from the processor circuitry.

Example 25 includes the method of any one of examples 23 or 24, further including orientating the outlets of the synthetic jets in a direction toward the processor circuitry.

Example 26 includes the method of any one of examples 23-25, further including orientating first outlets of a first set of the synthetic jets in a direction toward the processor circuitry and orientating second outlets of a second set of the synthetic jets in a direction away from the processor circuitry.

The following claims are hereby incorporated into this Detailed Description by this reference, with each claim standing on its own as a separate embodiment of the present disclosure.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An electronic device comprising:

a heat spreader including a first surface and a second surface opposite the first surface, the heat spreader includes a hole extending between the first surface and the second surface, the hole of the heat spreader having a first longitudinal axis that is non-parallel relative to the first surface and the second surface of the heat spreader;

a synthetic jet coupled to the first surface of the heat spreader, the synthetic jet defining a fluid passageway having an inlet, a first outlet and a second outlet, the first outlet having a second longitudinal axis, the second outlet having a third longitudinal axis, the second longitudinal axis of the first outlet being non-parallel relative to the third longitudinal axis of the second outlet, the hole of the heat spreader to axially align with the second outlet of the synthetic jet to define a bypass passageway through the heat spreader, the synthetic jet and the heat spreader to bifurcate airflow from the inlet such that the first outlet is to provide a first exhaust airflow from the fluid passageway adjacent the first surface of the heat spreader and the second outlet is to provide a second exhaust airflow from the fluid passageway adjacent the second surface of the heat spreader via the bypass passageway; and a heat exchanger adjacent the second surface of the heat spreader, the heat exchanger to receive the second exhaust airflow from the bypass passageway.

2. The electronic device of claim 1, wherein the first outlet of the synthetic jet is in a first wall of a body of the synthetic jet and the second outlet of the synthetic jet is in a second wall of the body of the synthetic jet, the first wall is non-parallel relative to the second wall.

3. The electronic device of claim 1, including a gasket between the synthetic jet and the first surface of the heat spreader, the gasket includes a slot to fluidly couple the hole of the heat spreader and the second outlet of the synthetic jet.

4. The electronic device of claim 1, wherein the heat exchanger is downstream from the second outlet.

5. The electronic device of claim 4, including a duct to channel fluid flow from the bypass passageway toward the heat exchanger.

6. The electronic device of claim 1, wherein the second surface of the heat spreader is oriented toward processor circuitry.

7. The electronic device of claim 6, wherein at least one of the first outlet or the second outlet is oriented in a direction away from the processor circuitry.

8. The electronic device of claim 6, wherein at least one of the first outlet or the second outlet is oriented in a direction towards the processor circuitry.

9. The electronic device of claim 6, wherein the synthetic jet is spaced laterally relative to a board supporting the processor circuitry such that the synthetic jet is outside a perimeter of the board supporting the processor circuitry.

10. The electronic device of claim 9, wherein the synthetic jet is not positioned over the processor circuitry.

11. The electronic device of claim 1, wherein the exhaust airflow from the first outlet does not flow through the heat exchanger.

12. The electronic device of claim 1, wherein the heat spreader is to distribute heat across a surface area of at least one of the first surface or the second surface to prevent localized hotspots.

13. The electronic device of claim 1, wherein the heat exchanger only receives the second exhaust airflow from the second outlet.

14. The electronic device of claim 1, wherein the heat spreader is between the heat exchanger and the synthetic jet.

15. The electronic device of claim 1, wherein the synthetic jet includes:

a body having a plurality of walls defining the fluid passageway;

a first wall of the plurality of walls having a first opening to define the inlet of the fluid passageway;

a second wall of the plurality of walls having a second opening to define the first outlet of the fluid passageway;

a third wall of the plurality of walls having a third opening to define the second outlet of the fluid passageway; and an actuator in the fluid passageway to generate a fluid flow from the inlet and to the first outlet and the second outlet.

16. The electronic device of claim 15, wherein the body is coupled to the heat spreader, the heat spreader including a fourth opening aligned with the third opening.

17. The electronic device of claim 15, wherein the second wall is perpendicular relative to the first wall and the third wall.

18. The electronic device of claim 15, including a gasket coupled to an outer surface of the third wall, the gasket having a slot aligned with the third opening.

19. The electronic device of claim 1, wherein the first longitudinal axis of the hole is normal to a parallel surface of the heat spreader.

20. The electronic device of claim 1, wherein the second longitudinal axis of the first outlet is perpendicular relative to the third longitudinal axis of the second outlet.

21. The electronic device of claim 1, wherein the first longitudinal axis of the hole of the heat spreader coaxially aligns with the third longitudinal axis of the second outlet of the synthetic jet.

22. An electronic device including:

processor circuitry;

a heat spreading plate to distribute heat from the processor circuitry across a larger surface area to prevent localized hotspots, the heat spreading plate including a plurality of holes extending through an upper heat spreading surface of the heat spreading plate and a lower heat spreading surface of the heat spreading plate, the holes being perpendicular to the upper heat spreading surface of the heat spreading plate;

a plurality of synthetic jets coupled to the heat spreading plate, the plurality of synthetic jets defining a first set of outlets and a second set of outlets, the first set of outlets to exhaust a first airflow from the synthetic jets to at least a portion of the upper heat spreading surface of the heat spreading plate, the second outlets to align with respective ones of the holes of the heat spreading plate to provide respective ones of bypass passageways through the heat spreading plate to enable the second set of outlets to exhaust a second airflow from the synthetic jets to at least a portion of the lower heat spreading surface of the heat spreading plate, the first exhaust airflow separated from the second exhaust airflow by the heat spreading plate.

23. The electronic device of claim 22, wherein the first and second sets of outlets of the synthetic jets are oriented in a direction away from the processor circuitry.

24. The electronic device of claim 22, wherein the first and second sets of outlets of the synthetic jets are oriented in a direction toward the processor circuitry.

25. The electronic device of claim 22, wherein a first plurality of the first and second outlets are oriented in a direction toward the processor circuitry and a second plurality of the first and second outlets are oriented in a direction away from the processor circuitry.

* * * * *